(12) United States Patent
Kobayashi

(10) Patent No.: US 8,219,954 B2
(45) Date of Patent: Jul. 10, 2012

(54) PRINTED CIRCUIT BOARD ANALYZING SYSTEM, PRINTED CIRCUIT BOARD DESIGNING ASSISTING SYSTEM, THEIR METHODS, AND PROGRAM

(75) Inventor: Naoki Kobayashi, Minato-ku (JP)

(73) Assignee: NEC Corporation, Tokyo (JP)

( * ) Notice: Subject to any disclaimer, the term of this patent is extended or adjusted under 35 U.S.C. 154(b) by 452 days.

(21) Appl. No.: 12/518,563

(22) PCT Filed: Dec. 6, 2007

(86) PCT No.: PCT/JP2007/073543
§ 371 (c)(1),
(2), (4) Date: Jun. 10, 2009

(87) PCT Pub. No.: WO2008/072530
PCT Pub. Date: Jun. 19, 2008

(65) Prior Publication Data
US 2010/0138800 A1    Jun. 3, 2010

(30) Foreign Application Priority Data
Dec. 13, 2006    (JP) ................................. 2006-336423

(51) Int. Cl.
*G06F 17/50* (2006.01)
(52) U.S. Cl. ........................... 716/115; 716/137; 703/16
(58) Field of Classification Search .................. 716/115, 716/137; 703/16
See application file for complete search history.

(56) References Cited

U.S. PATENT DOCUMENTS

| | | | | |
|---|---|---|---|---|
| 6,385,252 B1 * | 5/2002 | Gradl et al. | ................... | 375/257 |
| 6,831,528 B2 * | 12/2004 | Nagata et al. | ................... | 333/101 |
| 6,970,030 B1 * | 11/2005 | Huang et al. | ................... | 327/296 |
| 6,979,773 B2 * | 12/2005 | Fursich | .......................... | 174/377 |
| 7,350,175 B2 * | 3/2008 | Iwaki et al. | .................... | 716/115 |
| 2002/0084868 A1 * | 7/2002 | Nagata et al. | ................... | 333/101 |
| 2005/0205280 A1 * | 9/2005 | Fursich | .................... | 174/35 GC |
| 2006/0033546 A1 * | 2/2006 | Huang et al. | ................... | 327/296 |
| 2006/0070015 A1 * | 3/2006 | Iwaki et al. | ...................... | 716/11 |

FOREIGN PATENT DOCUMENTS

| | | |
|---|---|---|
| JP | 11-054860 A | 2/1999 |
| JP | 2001-332825 A | 11/2001 |
| JP | 2004-334654 A | 11/2004 |

OTHER PUBLICATIONS

Naoki Kobayashi, et al., "Analysis of Multilayered Power-Distribution Planes with Via Structures Using SPICE," IEICE Technical Report, The Institute of Electronics, Information and Communication Engineers, Oct. 21, 2005, pp. 25-30, vol. 105, No. 367, EMCJ2005-97.

Takashi Harada, et al., "Power-Distribution-Plane Analysis for Multilayer Printed Circuit Boards with SPICE," IEMT/IMC Proceedings, 2000, pp. 420-425.

S. Ramos, et al., "Fields and Waves in Communication Electronics, Third Edition," p. 616, Pergamon Press, Oxford, 1980.

* cited by examiner

*Primary Examiner* — Phallaka Kik
(74) *Attorney, Agent, or Firm* — Sughrue Mion, PLLC

(57) ABSTRACT

A printed circuit board analyzing system for analyzing the whole circuit of a multilayer printed circuit board to perform circuit analysis of noise propagation in the printed circuit board having structure in which the shapes of stacked conductor planes are different or planes are provided side by side in the same layer by quickly providing an adjacent interference part equivalent circuit model representing noise interference parts causing interference between adjacent opposed planes and by coupling the plane pairs to the adjacent interference part equivalent circuit.

16 Claims, 20 Drawing Sheets

PRINTED CIRCUIT BOARD ANALYZING SYSTEM, PRINTED CIRCUIT BOARD DESIGNING ASSISTING SYSTEM, THEIR METHODS, AND PROGRAM

TECHNICAL FIELD

The present invention relates to printed circuit board structures. For example, it relates to a printed circuit board analyzing system, a printed circuit board analyzing method and a printed circuit board analyzing program for efficiently handling noise propagation in a configuration constructed from a plurality of solid planes including different shapes; a printed circuit board design supporting system, a printed circuit board design supporting method and a printed circuit board design supporting program for suppressing electromagnetic interference in a printed circuit board structure constructed from a plurality of solid planes including different shapes; and printed circuit board structures.

BACKGROUND ART

As electronic devices achieve a higher processing speed, a problem of electromagnetic noise propagation within a printed circuit board becomes conspicuous. Electromagnetic noise (which will be referred to simply as noise hereinbelow) is caused by switching noise in IC's or leakage from signal chains. The noise propagates throughout the printed circuit board. As a result, the noise enters input/output terminals in LSI's to deteriorate their characteristics. Moreover, it is a main factor of a problem of EMI (leaked electromagnetic waves). Therefore, it is important to take account of a behavior of noise within a multi-layer printed circuit board in designing the board. To this end, it is important to analyze electromagnetic wave noise propagation by expressing it using a linear time-invariant equivalent circuit model suitable for SPICE, which is a general-purpose circuit simulator, to create the model. Currently, we have had a reliable equivalent circuit model for a structure of a printed circuit board having stacked conductive planes of the same shape. However, no reliable model has been proposed for a structure having stacked conductive planes of different shapes or having a plurality of conductive planes in the same layer. There has been proposed a noise analysis method, which is limited to a pair of conductor planes of the same shape, disclosed in a paper (T. Harada, et al.: "Power-Distribution-Plane Analysis for Multilayer Printed Circuit Boards with SPICE," Proceeding of 2000 IEMT/IMC symposium, pp. 420-425, April, 2000), for example. This method comprises approximating a conductor plane pair by a planar circuit and defining a fine mesh to create an equivalent circuit model, and noise propagation can be determined using a circuit solver such as SPICE from a noise source at a joint between a power supply terminal of an LSI and the printed circuit board.

Now a conventional analysis method for a conductor plane pair will be briefly described with reference to the accompanying drawings. FIG. 17 shows an LSI package and a printed circuit board connected thereto. The printed circuit board includes a pair of conductor planes representing a power-supply/ground plane pair. In FIG. 17, designations are as follows: 100: an LSI package, 101: an LSI power supply terminal, 102: an LSI ground terminal, 103: a printed circuit board power supply terminal, 104: a printed circuit board ground terminal, 105: a printed circuit board dielectric layer, 106: a printed circuit board ground plane, 107: a printed circuit board power supply plane, 108: a via connecting the printed circuit board power supply plane with power supply terminal, and 109: a clearance hole through the ground plane 106 for passing the via 108 therethrough. An actual printed circuit board is additionally mounted with a power supply terminal and a ground terminal for direct current power supply, as well as a decoupling pad and wirings for connecting the terminals together as needed and as appropriate.

FIG. 18 is a diagram showing the pair of conductor planes in FIG. 17 represented by an equivalent circuit model using a mesh. Reference numeral 201 designates a top view of the equivalent circuit model of the conductor plane pair. Reference symbols a(b) each designate the size of a transverse edge (the size of a longitudinal edge) of the conductor plane pair. Reference symbols $\Delta x(\Delta y)$ each designate the size of a transverse edge (the size of a longitudinal edge) of a cell of the mesh. Reference numeral 202 is a specific circuit representation of one cell of the mesh of the circuit model 201 of the conductor plane pair. Reference symbols Rx(Ry) each designate a resistance along a transverse side (a resistance along a longitudinal side). Lx(Ly) each designate an inductance in the transverse direction (an inductance in the longitudinal direction). Reference numeral 203 designates a side view of the equivalent circuit model of the conductor plane pair, where H designates a thickness of the conductor plane pair. Reference numeral 204 is a specific representation of a circuit constant on one edge in a height direction of the circuit model designated by 203. Reference symbols Cz(Gz) each designate a capacitance (conductance). Reference numeral 205 designates a ground point in the circuit model.

FIG. 19 shows a model in which current from the LSI power supply terminal in FIG. 17 entering the printed circuit board is regarded as a current source and the current source is connected to the equivalent circuit model in FIG. 18. Reference numeral 301 designates a current source in the modeled LSI power supply terminal, and 302 designates a side view of the equivalent circuit model of the printed circuit board taken through a plane in which the power supply terminal lies. Reference numeral 303 designates a node corresponding to a part in which the power supply terminal of the printed circuit board lies. By solving the model in FIG. 19 using a circuit solver such as SPICE, a distribution of voltage at the nodes can be calculated. Thus, a distribution of noise in a printed circuit board can be known.

Another method of creating an equivalent circuit for a case in which a plurality of pairs of conductive planes are present and upper and lower plane pairs are electrically connected to each other through a via is disclosed in a paper (N. Kobayashi, et al.: "Analysis of Multilayered Power-Distribution Planes with Via Structures using SPICE," IEICE Technical Report, EMCJ2005-97, pp. 25-30, October, 2005). In particular, for a multi-layer printed circuit board in which two plane pairs are present and upper and lower plane pairs are connected to each other through a via as shown in FIG. 20, and representing an upper plane pair as Pair-1 and a lower plane pair as Pair-2, each plane pair is represented by creating the aforementioned equivalent circuit model, and upper and lower nodes electrically connected through the via are connected with an equivalent circuit of a single inductance or a via model that was separately prepared, as shown in FIG. 21.

Non-patent Document 1: T. Harada, et al.: "Power-Distribution-Plane Analysis for Multilayer Printed Circuit Boards with SPICE," Proceeding of 2000 IEMT/IMC symposium, pp. 420-425, April, 2000.

Non-Patent Document 2: N. Kobayashi, et al.: "Analysis of Multilayered Power-Distribution Planes with Via Structures using SPICE," IEICE Technical Report, EMCJ2005-97, pp. 25-30, October, 2005.

DISCLOSURE OF THE INVENTION

Problems to be Solved by the Invention

As described above, a conventional circuit model analysis of noise propagation may be applied to a printed circuit board having a single pair of conductor planes, or to a printed circuit board having a plurality of pairs of conductor planes constituting a stacked structure in which the shapes of the opposed planes may be considered to be the same.

To perform a circuit analysis of noise propagation on a printed circuit board of a stacked structure having conductive planes of different shapes or on a printed circuit board having a plurality of planes in the same layer, however, a circuit model representing noise propagation in a part of different shapes must be created and coupled to analyze the whole circuit model.

Moreover, along with the aforementioned system, it is important to provide a design supporting system for suppressing noise propagation in a printed circuit board having conductive planes of different shapes or having a plurality of planes in the same layer.

Therefore, a first problem to be solved by the present invention is, in order to enable a circuit analysis of noise propagation in a printed circuit board on a multi-layer printed circuit board structure having stacked conductive planes of different shapes or having a plurality of planes side by side in the same layer, to provide a printed circuit board analyzing system for quickly providing an adjacent interference part equivalent circuit model representing a noise interference part between adjacent opposed plane pairs, and performing whole circuit analysis on the plane pairs coupled with the adjacent interference part equivalent circuit.

A second problem to be solved by the present invention is to provide, along with the aforementioned system, a novel design supporting system for suppressing noise propagation in a printed circuit board having conductive planes of different shapes or having a plurality of planes in the same layer.

Means for Solving the Problems

The aforementioned problems are solved by a printed circuit board analyzing system comprising:

printed circuit board opposed plane pair equivalent circuit input means for inputting equivalent circuits of a plurality of opposed plane pairs in a printed circuit board, a noise source, an observation point, and an analysis frequency;

adjacent interference part input means for specifying an adjacent interference part within the opposed plane pair equivalent circuits input by said printed circuit board opposed plane pair equivalent circuit input means;

adjacent interference part equivalent circuit creating means for creating an equivalent circuit of the adjacent interference part input by said adjacent interference part input means; and whole printed circuit board equivalent circuit creating means for creating a whole printed circuit board equivalent circuit by coupling the equivalent circuits input by said printed circuit board opposed plane pair equivalent circuit input means with the adjacent interference part created by said adjacent interference part equivalent circuit creating means.

The aforementioned problems are also solved by a printed circuit board analyzing system comprising:

printed circuit board opposed plane pair equivalent circuit input means for inputting equivalent circuits of a plurality of opposed plane pairs in a printed circuit board, a noise source, an observation point, and an analysis frequency;

adjacent interference part input means for specifying an adjacent interference part within the opposed plane pair equivalent circuits input by said printed circuit board opposed plane pair equivalent circuit input means;

adjacent interference part equivalent circuit creating means for creating an equivalent circuit of the adjacent interference part input by said adjacent interference part input means;

whole printed circuit board equivalent circuit creating means for creating a whole printed circuit board equivalent circuit by coupling the equivalent circuits input by said printed circuit board opposed plane pair equivalent circuit input means with the adjacent interference part created by said adjacent interference part equivalent circuit creating means;

circuit solver specifying means for specifying a circuit solver for calculating the whole printed circuit board equivalent circuit created by said whole printed circuit board equivalent circuit creating means;

voltage calculating means for calculating the whole printed circuit board equivalent circuit created by said whole printed circuit board equivalent circuit creating means using the circuit solver specified by said circuit solver specifying means at the analysis frequency input by said printed circuit board opposed plane pair equivalent circuit input means; and voltage display means for displaying a calculated voltage value at the observation point specified by said printed circuit board opposed plane pair equivalent circuit input means from among the calculated voltage values calculated by said voltage calculating means.

The aforementioned problems are also solved by a printed circuit board analyzing method comprising:

a printed circuit board opposed plane pair equivalent circuit input step for inputting information about opposed plane pair equivalent circuits in a printed circuit board, a voltage observation point, an adjacent interference part position, an analysis frequency, and a circuit solver;

an adjacent interference part equivalent circuit creating step for creating an equivalent circuit of the printed circuit board adjacent interference part input at said printed circuit board opposed plane pair equivalent circuit input step;

a whole printed circuit board equivalent circuit creating step for creating an equivalent circuit of the whole printed circuit board by coupling the printed circuit board opposed plane pair equivalent circuits input at said printed circuit board opposed plane pair equivalent circuit input step with the adjacent interference part equivalent circuit created at said adjacent interference part equivalent circuit creating step in the adjacent interference part specified at said printed circuit board opposed plane pair equivalent circuit input step;

a voltage calculating step for calculating a voltage value in the equivalent circuit of the whole printed circuit board created at said whole printed circuit board equivalent circuit creating step using a circuit solver; and a calculated voltage value displaying step for displaying for each analysis frequency a voltage value corresponding to the voltage observation point input at said printed circuit board opposed plane pair equivalent circuit input step from among the voltage values calculated at said voltage calculating step.

The aforementioned problems are also solved by a printed circuit board analyzing program causing an information processing apparatus to execute:

printed circuit board opposed plane pair equivalent circuit input processing for inputting information about opposed plane pair equivalent circuits in a printed circuit board, a voltage observation point, an adjacent interference part position, an analysis frequency, and a circuit solver;

adjacent interference part equivalent circuit creating processing for creating an equivalent circuit of the printed circuit board adjacent interference part input by said printed circuit board opposed plane pair equivalent circuit input processing;

whole printed circuit board equivalent circuit creating processing for creating an equivalent circuit of a whole printed circuit board by coupling the printed circuit board opposed plane pair equivalent circuits input by said printed circuit board opposed plane pair equivalent circuit input processing with the adjacent interference part equivalent circuit created by said adjacent interference part equivalent circuit creating processing in the adjacent interference part specified by said printed circuit board opposed plane pair equivalent circuit input processing;

voltage calculating processing for calculating a voltage value in the equivalent circuit of the whole printed circuit board created by said whole printed circuit board equivalent circuit creating processing using a circuit solver; and calculated voltage value displaying processing for displaying for each analysis frequency a voltage value corresponding to the voltage observation point input by said printed circuit board opposed plane pair equivalent circuit input processing from among the voltage values calculated by said voltage calculating processing.

Moreover, the aforementioned problems are solved by a printed circuit board design supporting system comprising:

printed circuit board structure information input means for inputting information about positional information for a power supply plane and a ground plane in a printed circuit board;

mesh defining means for inputting a mesh interval for lattice-point generation required by power-supply-plane/ground-plane extracting means;

adjacent interference suppressing via interval input means for inputting a via interval for adjacent interference suppressing via positioning display;

power-supply-plane/ground-plane extracting means for storing a position at which the power supply plane lies and a position at which the ground plane lies in the printed circuit board based on the information input by said mesh defining means;

adjacent interference part extracting means for extracting a region acting as an adjacent interference part based on the information stored by said power-supply-plane/ground-plane extracting means; and adjacent interference suppressing via positioning display means for displaying recommended via positioning along the adjacent interference part extracted by said adjacent interference part extracting means and at the via intervals specified by said mesh defining means.

The aforementioned problems are also solved by a printed circuit board design supporting method comprising:

a printed circuit board structure information input step for performing input of printed circuit board structure information, a definition of a mesh, and a specification of an adjacent interference suppressing via interval;

a power-supply-plane/ground-plane extracting step for extracting positional information for a power supply plane and a ground plane from the printed circuit board structure information input at said printed circuit board structure information input step;

an adjacent interference part extracting step for performing extraction of an adjacent interference part from the positional information for the power supply plane and ground plane extracted at said power-supply-plane/ground-plane extracting step; and an adjacent interference part via positioning step for displaying a mark indicating where to position adjacent interference suppressing ground via along the adjacent interference part extracted at said adjacent interference part extracting step while maintaining the via interval input at said printed circuit board structure information input step.

The aforementioned problems are also solved by a printed circuit board design supporting program causing an information processing apparatus to execute:

printed circuit board structure information input processing for performing input of printed circuit board structure information, a definition of a mesh, and a specification of an adjacent interference suppressing via interval;

power-supply-plane/ground-plane extracting processing for extracting positional information for a power supply plane and a ground plane from the printed circuit board structure information input by said printed circuit board structure information input processing;

adjacent interference part extracting processing for performing extraction of an adjacent interference part from the positional information for the power supply plane and ground plane extracted by said power-supply-plane/ground-plane extracting processing; and adjacent interference part via positioning processing for displaying a mark indicating where to position adjacent interference suppressing ground via along the adjacent interference part extracted by said adjacent interference part extracting processing while maintaining the via interval input by said printed circuit board structure information input processing.

Furthermore, the aforementioned problems are solved by a printed circuit board design supporting system comprising:

analysis evaluative printed circuit board opposed plane pair two-dimensional equivalent circuit input means for inputting information on a two-dimensional equivalent circuit of a part in which plane conductors in the form of a simulative printed circuit board for performing interference analysis evaluation are opposed to each other, a noise source, and a position serving as an observation point;

analysis evaluative printed circuit board adjacent interference part input means for specifying a position at which adjacent opposed plane pairs in said analysis evaluative printed circuit board equivalent circuit model induce noise interference through an adjacent interference part;

analysis evaluative printed circuit board adjacent interference part equivalent circuit creating means having a function of creating an equivalent circuit of the adjacent interference part at the position specified by said analysis evaluative printed circuit board adjacent interference part input means;

analysis evaluative whole printed circuit board equivalent circuit creating means having a function of coupling the equivalent circuit specified by said analysis evaluative printed circuit board opposed plane pair two-dimensional equivalent circuit input means with the equivalent circuit created by said analysis evaluative printed circuit board adjacent interference part equivalent circuit creating means at a position corresponding to that specified by said analysis evaluative printed circuit board adjacent interference part input means;

circuit solver specifying means having a function of specifying a solver for calculating an equivalent circuit;

suppressed-interference specifying means having a function of specifying beforehand a desired suppressed interference between a plurality of opposed plane pair equivalent circuit blocks input by said analysis evaluative printed circuit board opposed plane pair two-dimensional equivalent circuit input means;

interference calculating means having a function of calculating an interference by calculating an equivalent circuit created by said analysis evaluative whole printed circuit board equivalent circuit creating means using the solver specified by said circuit solver specifying means at the analysis frequency specified by said analysis evaluative printed circuit board opposed plane pair two-dimensional equivalent circuit input means, comparing the calculated interference with the suppressed interference specified by said suppressed-interference specifying means, and if the calculated interference is smaller than the suppressed interference specified by said suppressed-interference specifying means, outputting a via interval in said analysis evaluative printed circuit board adjacent interference part to an adjacent interference suppressing via positioning display section, or otherwise, prompting an analysis evaluative printed circuit board adjacent interference part via positioning specifying section to recalculation;

analysis evaluative printed circuit board adjacent interference part via positioning specifying means having a function of, if the interference calculated by said interference calculating means is greater than the interference specified by said suppressed-interference specifying means, calculating an interval for positioning vias along the analysis evaluative printed circuit board adjacent interference part according to a certain rule, and supplying the information as an input to the analysis evaluative whole printed circuit board equivalent circuit creating section;

design-supporting printed circuit board structure information input means having a function of inputting information about positional information for a power supply plane and a ground plane in a design-support-target printed circuit board;

mesh defining means having a function of inputting a mesh interval for lattice-point generation required by a power-supply-plane/ground-plane extracting section for the design-support-target printed circuit board;

design-supporting printed circuit board power-supply-plane/ground-plane extracting means having a function of storing a position at which the power supply plane lies and a position at which the ground plane lies in the design-support-target printed circuit board based on the information input by said mesh defining means;

design-supporting printed circuit board adjacent interference part extracting means having a function of extracting, for the design-support-target printed circuit board, a region acting as an adjacent interference part in the design-support-target printed circuit board based on the information stored by said power-supply-plane/ground-plane extracting means; and design-supporting printed circuit board adjacent interference via positioning display means having a function of displaying vias positioning along the adjacent interference part extracted by said design-supporting printed circuit board adjacent interference part extracting means according to the recommended via positioning interval output by said interference calculating section.

The aforementioned problems are also solved by a printed circuit board design supporting method comprising:

an analysis evaluative printed circuit board information input step for inputting information about analysis evaluative printed circuit board opposed plane pair equivalent circuit information, an analysis evaluative printed circuit board adjacent interference part position, an analysis frequency, a suppressed interference, a circuit solver, a structure of a design-support-target printed circuit board, and a mesh definition;

an adjacent interference part equivalent circuit creating step for creating an equivalent circuit of the analysis evaluative printed circuit board adjacent interference part specified at said analysis evaluative printed circuit board information input step;

a whole printed circuit board equivalent circuit creating step for creating an equivalent circuit of the whole analysis evaluative plane circuit board by coupling the analysis evaluative printed circuit board opposed plane pair equivalent circuit input at said analysis evaluative printed circuit board information input step with the analysis evaluative adjacent interference part equivalent circuit created at said adjacent interference part equivalent circuit creating step in the analysis evaluative printed circuit board adjacent interference part specified at said analysis evaluative printed circuit board information input step, and if there exists via positioning specified by an analysis evaluative printed circuit board adjacent interference part via positioning specifying section, creating an equivalent circuit model of the vias at the corresponding positions;

an interference calculating step for calculating an interference by calculating a voltage value in the equivalent circuit of the whole analysis evaluative printed circuit board created at said whole printed circuit board equivalent circuit creating step using the circuit solver specified at said analysis evaluative printed circuit board information input step;

an interference comparing step for comparing the interference calculated at said interference calculating step with the suppressed interference specified at said analysis evaluative printed circuit board information input step, and if a case in which the interference calculated at the analysis frequency is greater than the suppressed interference is encountered, going to an adjacent interference part via positioning interval specifying step, or otherwise, going to a design-supporting printed circuit board power-supply-plane/ground-plane positional information extracting step;

an adjacent interference part via positioning interval specifying step for specifying a positioning interval for vias in the adjacent interference part in the analysis evaluative printed circuit board using a formula with which the interval is decremented for each iteration, and going back to said whole printed circuit board equivalent circuit creating step;

a design-supporting printed circuit board power-supply-plane/ground-plane positional information extracting step for extracting positional information for a power supply plane and a ground plane in the design-supporting printed circuit board;

a design-support-target printed circuit board adjacent interference part extracting step for extracting an adjacent interference part in the design-support-target printed circuit board; and a design-support-target printed circuit board via displaying step for displaying vias along the adjacent interference part in the design-support-target printed circuit board at via positioning intervals specified at said adjacent interference part via positioning interval specifying step.

The aforementioned problems are also solved by a printed circuit board design supporting program causing an information processing apparatus to execute:

analysis evaluative printed circuit board information input processing for inputting information about analysis evaluative printed circuit board opposed plane pair equivalent circuit information, an analysis evaluative printed circuit board adjacent interference part position, an analysis frequency, a suppressed interference, a circuit solver, a structure of a design-support-target printed circuit board, and a mesh definition;

adjacent interference part equivalent circuit creating processing for creating an equivalent circuit of the analysis evaluative printed circuit board adjacent interference part specified by said analysis evaluative printed circuit board information input processing;

whole printed circuit board equivalent circuit creating processing for creating an equivalent circuit of the whole analysis evaluative plane board by coupling the analysis evaluative printed circuit board opposed plane pair equivalent circuit input by said analysis evaluative printed circuit board information input processing with the analysis evaluative adjacent interference part equivalent circuit created by said adjacent interference part equivalent circuit creating processing in the analysis evaluative printed circuit board adjacent interference part specified by said analysis evaluative printed circuit board information input processing, and if there exists via positioning specified by an analysis evaluative printed circuit board adjacent interference part via positioning specifying section, creating an equivalent circuit model of the vias at the corresponding positions;

interference calculating processing for calculating an interference by calculating a voltage value in the equivalent circuit of the whole analysis evaluative printed circuit board created by said whole printed circuit board equivalent circuit creating processing using the circuit solver specified by said analysis evaluative printed circuit board information input processing;

interference comparing processing for comparing the interference calculated by said interference calculating processing with the suppressed interference specified by said analysis evaluative printed circuit board information processing, and if a case in which the interference calculated at the analysis frequency is greater than the suppressed interference is encountered, going to adjacent interference part via positioning interval specifying processing, or otherwise, going to design-supporting printed circuit board power-supply-plane/ground-plane positional information extracting processing;

adjacent interference part via positioning interval specifying processing for specifying a positioning interval for vias in the adjacent interference part in said analysis evaluative printed circuit board using a formula with which the interval is decremented for each iteration, and going back to said whole printed circuit board equivalent circuit creating processing;

design-supporting printed circuit board power-supply-plane/ground-plane positional information extracting processing for extracting positional information for a power supply plane and a ground plane in said design-supporting printed circuit board;

design-support-target printed circuit board adjacent interference part extracting processing for extracting an adjacent interference part in the design-support-target printed circuit board; and design-support-target printed circuit board via displaying processing for displaying vias along the adjacent interference part in the design-support-target printed circuit board at via positioning intervals specified by said adjacent interference part via positioning interval specifying processing.

Effects of the Invention

According to the present invention, an equivalent circuit model of a printed circuit board having a plurality of plane pairs and an adjacent interference part can be instantly created and a voltage value at a specified observation point can be calculated. This is very important in circuit design applications or EMC applications in which quick and highly reliable noise analysis is required.

Moreover, recommended via positioning can be calculated for suppressing interference in a printed circuit board having a plurality of plane pairs and an adjacent interference part. This is very important in circuit design applications or EMC applications in which noise suppression is desired.

EXPLANATION OF SYMBOLS

Figure 1:
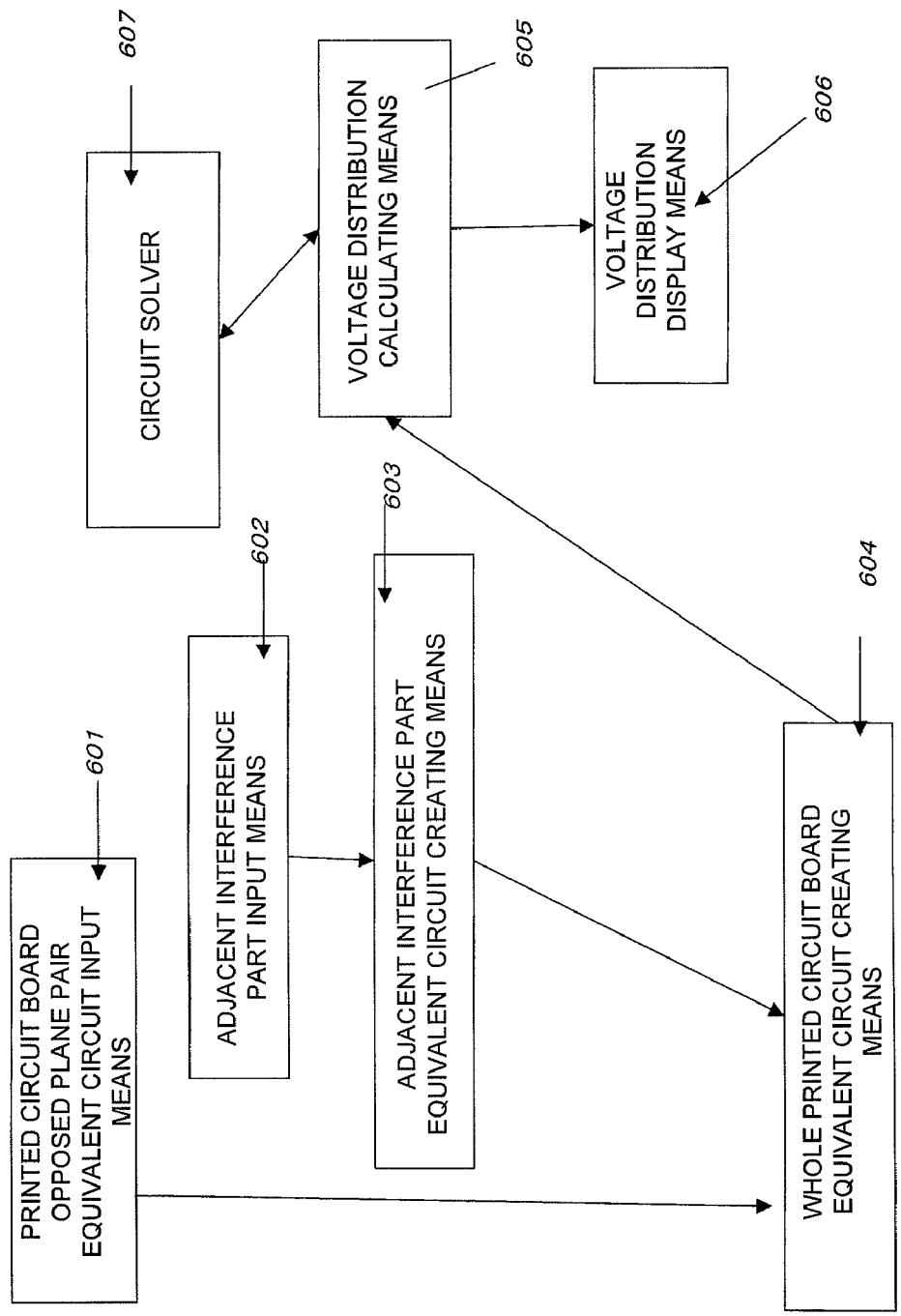
[FIG. 1] A block diagram of a printed circuit board analyzing system in a first embodiment.

100 LSI package
101 LSI power supply terminal

102 LSI ground terminal
103 Printed circuit board power supply terminal
104 Printed circuit board ground terminal
105 Printed circuit board dielectric layer
106 Printed circuit board ground plane
107 Printed circuit board power supply plane
108 Via
109 Via hole
201 Equivalent circuit model of power-supply/ground planes (top view)
202 Equivalent circuit model of one cell in mesh of power-supply/ground planes (top view)
203 Equivalent circuit model of power-supply/ground planes (side view)
204 Equivalent circuit model of one cell in mesh of power-supply/ground planes (side view)
205 Ground
301 Current source
302 Equivalent circuit model of power-supply/ground planes (side view)
303 Node representing power supply terminal part
601 Printed circuit board opposed plane pair equivalent circuit input means
602 Adjacent interference part input means
603 Adjacent interference part equivalent circuit creating means
604 Whole printed circuit board equivalent circuit creating means
605 Voltage calculating means
606 Voltage distribution display means
607 Circuit solver
S701 Printed circuit board opposed plane pair equivalent circuit setting/adjacent interference part specifying/analysis frequency setting/circuit solver specifying step
S702 Adjacent interference part equivalent circuit creating step
S703 Whole printed circuit board equivalent circuit creating step
S704 Voltage calculating step
S705 Voltage displaying step
801 Printed circuit board opposed plane pair 1
802 Printed circuit board opposed plane pair 2
803 Printed circuit board opposed plane pair 3
804 Printed circuit board adjacent interference part
805 Printed circuit board conductive planes
806 Noise propagation going out from printed circuit board opposed plane pair 1 to opposed plane pair 3
807 Noise propagation coming from printed circuit board opposed plane pair 1 to opposed plane pair 3
901 Right end of equivalent circuit of opposed plane pair 1
902 Right end of equivalent circuit of opposed plane pair 2
903 Left end of equivalent circuit of opposed plane pair 3
904 Three-port network
1001 1:1 ideal transformer
1101 Printed circuit board opposed plane pair 1
1102 Printed circuit board opposed plane pair 2
1103 Printed circuit board opposed plane pair N−1
1104 Printed circuit board opposed plane pair N
1105 Printed circuit board opposed plane pair N+1
1106 Printed circuit board adjacent interference part
1107 Printed circuit board conductive planes
1201 Right end of equivalent circuit of opposed plane pair 1
1202 Right end of equivalent circuit of opposed plane pair 2
1203 Right end of equivalent circuit of opposed plane pair N−1
1204 Right end of equivalent circuit of opposed plane pair N
1205 Left end of equivalent circuit of opposed plane pair N+1
1206 (N+1)-port network
1301 Ideal transformer 1
1302 Ideal transformer 2
1303 Ideal transformer N−1
1401 Printed circuit board structure information input means
1402 Mesh defining means
1403 Adjacent interference suppressing via interval input means
1404 Power-supply-plane/ground-plane extracting means
1405 Adjacent interference part extracting means
1406 Adjacent interference suppressing via positioning display means
S1501 Printed circuit board structure information inputting/mesh defining/adjacent interference suppressing via interval specifying step
S1502 Power-supply-plane/ground-plane extracting step
S1503 Adjacent interference part extracting step
S1504 Adjacent interference suppressing via positioning displaying step
1601 Top view of intermediate conductive plane in printed circuit board structure without adjacent interference part via
1602 Side view of printed circuit board structure without adjacent interference part via
1603 Top view of intermediate conductive plane in printed circuit structure with adjacent interference part via
1604 Side view of printed circuit board structure with adjacent interference part via
1605 Transverse dimension of left intermediate conductive plane in printed circuit board
1606 Transverse dimension of right intermediate conductive plane in printed circuit board
1607 Distance between intermediate conductors in printed circuit board
1608 Intra-layer distance of first dielectric layer in printed circuit board
1609 Intra-layer distance of second dielectric layer in printed circuit board
1610 First conductive plane in printed circuit board
1611 Second conductive plane in printed circuit board
1612 Third conductive plane in printed circuit board
1613 Noise generating position in printed circuit board
1614 Noise observation point in printed circuit board
1615 Distance between noise generating position and left end of printed circuit board
1616 Distance between noise generating position and lower end of printed circuit board
1617 Longitudinal dimension of printed circuit board
1618 Distance between observation point and lower end of printed circuit board
1619 Distance between observation point and right end of printed circuit board
1620 Via interval in adjacent interference part in printed circuit board
1621 Distance from edge to via in printed circuit board
1901 Analysis evaluative printed circuit board opposed plane pair equivalent circuit input means
1902 Analysis evaluative adjacent interference part input means
1903 Analysis evaluative adjacent interference part via positioning specifying means
1904 Analysis evaluative adjacent interference part equivalent circuit creating means

1905 Analysis evaluative whole printed circuit board equivalent circuit creating means
1906 Circuit solver
1907 Interference calculating means
1908 Suppressed-interference specifying means
1909 Design-supporting printed circuit board structure information input means
1910 Mesh defining means
1911 Design-supporting printed circuit board power-supply-plane/ground-plane extracting means
1912 Design-supporting printed circuit board adjacent interference part extracting means
1913 Design-supporting printed circuit board adjacent interference suppressing via positioning display means
S2001 Analysis evaluative printed circuit board opposed plane pair equivalent circuit setting/analysis evaluative printed circuit board adjacent interference part specifying/analysis frequency setting/suppressed-interference setting/circuit solver specifying/design-support-target printed circuit board structure information inputting/mesh defining step
S2002 Analysis evaluative printed circuit board adjacent interference part equivalent circuit creating step
S2003 Analysis evaluative whole printed circuit board equivalent circuit creating step
S2004 Interference calculation
S2005 Step of deciding whether calculated suppressed interference is smaller than set value
S2006 Analysis evaluative printed circuit board adjacent interference part via positioning specifying step
S2007 Power-supply-plane/ground-plane extracting step
S2008 Adjacent interference part extracting step
S2009 Adjacent interference suppressing via positioning display section step
2101 Input/output system
2102 Storage medium
2103 Memory
2104 Calculation system
2105 Display system
2106 Bus

BEST MODES FOR CARRYING OUT THE INVENTION

A printed circuit board analyzing system in accordance with the present invention (a first aspect of the invention) has printed circuit board opposed plane pair equivalent circuit input means for inputting equivalent circuits of a plurality of opposed plane pairs in a printed circuit board, a noise source, an observation point, and an analysis frequency. It also has adjacent interference part input means for specifying an adjacent interference part within the opposed plane pair equivalent circuits input by said printed circuit board opposed plane pair equivalent circuit input means. It also has adjacent interference part equivalent circuit creating means for creating an equivalent circuit of the adjacent interference part input by said adjacent interference part input means. It also has whole printed circuit board equivalent circuit creating means for creating a whole printed circuit board equivalent circuit by coupling the equivalent circuits input by said printed circuit board opposed plane pair equivalent circuit input means with the adjacent interference part created by said adjacent interference part equivalent circuit creating means.

A printed circuit board analyzing system in accordance with the present invention (a second aspect of the invention) has printed circuit board opposed plane pair equivalent circuit input means for inputting equivalent circuits of a plurality of opposed plane pairs in a printed circuit board, a noise source, an observation point, and an analysis frequency. It also has adjacent interference part input means for specifying an adjacent interference part within the opposed plane pair equivalent circuits input by said printed circuit board opposed plane pair equivalent circuit input means. It also has adjacent interference part equivalent circuit creating means for creating an equivalent circuit of the adjacent interference part input by said adjacent interference part input means. It also has whole printed circuit board equivalent circuit creating means for creating a whole printed circuit board equivalent circuit by coupling the equivalent circuits input by said printed circuit board opposed plane pair equivalent circuit input means with the adjacent interference part created by said adjacent interference part equivalent circuit creating means. It also has circuit solver specifying means for specifying a circuit solver for calculating the whole printed circuit board equivalent circuit created by said whole printed circuit board equivalent circuit creating means. It also has voltage calculating means for calculating the whole printed circuit board equivalent circuit created by said whole printed circuit board equivalent circuit creating means using the circuit solver specified by said circuit solver specifying means at the analysis frequency input by said printed circuit board opposed plane pair equivalent circuit input means. It also has voltage display means for displaying a calculated voltage value at the observation point specified by said printed circuit board opposed plane pair equivalent circuit input means from among the calculated voltage values calculated by said voltage calculating means.

A third aspect of the present invention is the first and second aspects of the invention, wherein: a model of the adjacent interference part equivalent circuit is constructed by using a three-port model serving as a joint equivalent circuit model between equivalent circuit models of two stacked plane pairs and an equivalent circuit model of a plane pair separate from said two pairs.

A fourth aspect of the present invention is the first-third aspects of the invention, wherein: a model of the adjacent interference part equivalent circuit is constructed by using an ideal transformer setting a condition that a sum of voltages in the adjacent interference part of the equivalent circuits of the two stacked pairs is equal to a voltage of the equivalent circuit model of the one non-stacked pair, said ideal transformer serving as a joint equivalent circuit model between the equivalent circuit models of the two stacked plane pairs and the equivalent circuit model of a plane pair separate from said two stacked pairs.

A fifth aspect of the present invention is the first-fourth aspects of the invention, wherein: a model of the adjacent interference part equivalent circuit is constructed by using an (N+1)-port model serving as a joint equivalent circuit model between equivalent circuit models of N (N: a natural number) stacked plain pairs and an equivalent circuit model of a plane pair separate from said N stacked pairs.

A sixth aspect of the present invention is the first-fifth aspect of the invention, wherein: a model of the adjacent interference part equivalent circuit is constructed by using (N−1) ideal transformers setting a condition that a sum of voltages in the adjacent interference part of the equivalent circuits of the N stacked pairs is equal to a voltage of the equivalent circuit model of the one non-stacked pair, said ideal transformers serving as a joint equivalent circuit model between the equivalent circuit models of the N (N: a natural number) stacked plain pairs and the equivalent circuit model of a plane pair separate from said N stacked pairs.

A printed circuit board analyzing method in accordance with the present invention (a seventh aspect of the invention) has a printed circuit board opposed plane pair equivalent circuit input step for inputting information about opposed plane pair equivalent circuits in a printed circuit board, a voltage observation point, an adjacent interference part position, an analysis frequency, and a circuit solver. It also has an adjacent interference part equivalent circuit creating step for creating an equivalent circuit of the printed circuit board adjacent interference part input at said printed circuit board opposed plane pair equivalent circuit input step. It also has a whole printed circuit board equivalent circuit creating step for creating an equivalent circuit of the whole printed circuit board by coupling the printed circuit board opposed plane pair equivalent circuits input at said printed circuit board opposed plane pair equivalent circuit input step with the adjacent interference part equivalent circuit created at said adjacent interference part equivalent circuit creating step in the adjacent interference part specified at said printed circuit board opposed plane pair equivalent circuit input step. It also has a voltage calculating step for calculating a voltage value in the equivalent circuit of the whole printed circuit board created at said whole printed circuit board equivalent circuit creating step using a circuit solver. It also has a calculated voltage value displaying step for displaying for each analysis frequency a voltage value corresponding to the voltage observation point input at said printed circuit board opposed plane pair equivalent circuit input step from among the voltage values calculated at said voltage calculating step.

An eighth aspect of the present invention is the seventh aspect of the invention, wherein: a model of the adjacent interference part equivalent circuit is constructed by using a three-port model serving as a joint equivalent circuit model between equivalent circuit models of two stacked plane pairs and an equivalent circuit model of a plane pair separate from said two pairs.

A ninth aspect of the present invention is the seventh and eighth aspects of the invention, wherein: a model of the adjacent interference part equivalent circuit is constructed by using an ideal transformer setting a condition that a sum of voltages in the adjacent interference part of the equivalent circuits of the two stacked pairs is equal to a voltage of the equivalent circuit model of the one non-stacked pair, said ideal transformer serving as a joint equivalent circuit model between the equivalent circuit models of the two stacked plane pairs and the equivalent circuit model of a plane pair separate from said two stacked pairs.

A tenth aspect of the present invention is the seventh-ninth aspects of the invention, wherein: a model of the adjacent interference part equivalent circuit is constructed by using an (N+1)-port model serving as a joint equivalent circuit model between equivalent circuit models of N (N: a natural number) stacked plain pairs and an equivalent circuit model of a plane pair separate from said N stacked pairs.

An eleventh aspect of the present invention is the seventh-tenth aspects of the invention, wherein: a model of the adjacent interference part equivalent circuit is constructed by using (N−1) ideal transformers setting a condition that a sum of voltages in the adjacent interference part of the equivalent circuits of the N stacked pairs is equal to a voltage of the equivalent circuit model of the one non-stacked pair, said ideal transformers serving as a joint equivalent circuit model between the equivalent circuit models of the N (N: a natural number) stacked plain pairs and the equivalent circuit model of a plane pair separate from said N stacked pairs.

A printed circuit board analyzing program in accordance with the present invention (a twelfth aspect of the invention) is a program causing an information processing apparatus to execute: printed circuit board opposed plane pair equivalent circuit input processing for inputting information about opposed plane pair equivalent circuits in a printed circuit board, a voltage observation point, an adjacent interference part position, an analysis frequency, and a circuit solver; adjacent interference part equivalent circuit creating processing for creating an equivalent circuit of the printed circuit board adjacent interference part input by said printed circuit board opposed plane pair equivalent circuit input processing; whole printed circuit board equivalent circuit creating processing for creating an equivalent circuit of the whole printed circuit board by coupling the printed circuit board opposed plane pair equivalent circuits input by said printed circuit board opposed plane pair equivalent circuit input processing with the adjacent interference part equivalent circuit created by said adjacent interference part equivalent circuit creating processing in the adjacent interference part specified by said printed circuit board opposed plane pair equivalent circuit input processing; voltage calculating processing for calculating a voltage value in the equivalent circuit of the whole printed circuit board created by said whole printed circuit board equivalent circuit creating processing using a circuit solver; and calculated voltage value displaying processing for displaying for each analysis frequency a voltage value corresponding to the voltage observation point input by said printed circuit board opposed plane pair equivalent circuit input processing from among the voltage values calculated by said voltage calculating processing.

A thirteenth aspect of the present invention is the twelfth aspect of the invention, wherein: a model of the adjacent interference part equivalent circuit is constructed by using a three-port model serving as a joint equivalent circuit model between equivalent circuit models of two stacked plane pairs and an equivalent circuit model of a plane pair separate from said two pairs.

A fourteenth aspect of the present invention is the twelfth and thirteenth aspects of the invention, wherein: a model of the adjacent interference part equivalent circuit is constructed by using an ideal transformer setting a condition that a sum of voltages in the adjacent interference part of the equivalent circuits of the two stacked pairs is equal to a voltage of the equivalent circuit model of the one non-stacked pair, said ideal transformer serving as a joint equivalent circuit model between the equivalent circuit models of the two stacked plane pairs and the equivalent circuit model of a plane pair separate from said two stacked pairs.

A fifteenth aspect of the present invention is the twelfth-fourteenth aspects of the invention, wherein: a model of the adjacent interference part equivalent circuit is constructed by using an (N+1)-port model serving as a joint equivalent circuit model between equivalent circuit models of N (N: a natural number) stacked plain pairs and an equivalent circuit model of a plane pair separate from said N stacked pairs.

A sixteenth aspect of the present invention is the twelfth-fifteenth aspects of the invention, wherein: a model of the adjacent interference part equivalent circuit is constructed by using (N−1) ideal transformers setting a condition that a sum of voltages in the adjacent interference part of the equivalent circuits of the N stacked pairs is equal to a voltage of the equivalent circuit model of the one non-stacked pair, said ideal transformers serving as a joint equivalent circuit model between the equivalent circuit models of the N (N: a natural number) stacked plain pairs and the equivalent circuit model of a plane pair separate from said N stacked pairs.

A printed circuit board design supporting system in accordance with the present invention (a seventeenth aspect of the invention) has printed circuit board structure information input means for inputting information about positional information for a power supply plane and a ground plane in a printed circuit board. It also has mesh defining means for inputting a mesh interval for lattice-point generation required by power-supply-plane/ground-plane extracting means. It also has adjacent interference suppressing via interval input means for inputting a via interval for adjacent interference suppressing via positioning display. It also has power-supply-plane/ground-plane extracting means for storing a position at which the power supply plane lies and a position at which the ground plane lies in the printed circuit board based on the information input by said mesh defining means. It also has adjacent interference part extracting means for extracting a region acting as an adjacent interference part based on the information stored by said power-supply-plane/ground-plane extracting means. It also has adjacent interference suppressing via positioning display means for displaying recommended via positioning along the adjacent interference part extracted by said adjacent interference part extracting means and at the via intervals specified by said mesh defining means.

A printed circuit board design supporting method in accordance with the present invention (an eighteenth aspect of the invention) has a printed circuit board structure information input step for performing input of printed circuit board structure information, a definition of a mesh, and a specification of an adjacent interference suppressing via interval. It also has a power-supply-plane/ground-plane extracting step for extracting positional information for a power supply plane and a ground plane from the printed circuit board structure information input at said printed circuit board structure information input step. It also has an adjacent interference part extracting step for performing extraction of an adjacent interference part from the positional information for the power supply plane and ground plane extracted at said power-supply-plane/ground-plane extracting step. It also has an adjacent interference part via positioning step for displaying a mark indicating where to position adjacent interference suppressing ground via along the adjacent interference part extracted at said adjacent interference part extracting step while maintaining the via interval input at said printed circuit board structure information input step.

A printed circuit board design supporting program in accordance with the present invention (a nineteenth aspect of the invention) is a program causing an information processing apparatus to execute: printed circuit board structure information input processing for performing input of printed circuit board structure information, a definition of a mesh, and a specification of an adjacent interference suppressing via interval; power-supply-plane/ground-plane extracting processing for extracting positional information for a power supply plane and a ground plane from the printed circuit board structure information input by said printed circuit board structure information input processing; adjacent interference part extracting processing for performing extraction of an adjacent interference part from the positional information for the power supply plane and ground plane extracted by said power-supply-plane/ground-plane extracting processing; and adjacent interference part via positioning processing for displaying a mark indicating where to position adjacent interference suppressing ground via along the adjacent interference part extracted by said adjacent interference part extracting processing while maintaining the via interval input by said printed circuit board structure information input processing.

A printed circuit board design supporting system in accordance with the present invention (a twentieth aspect of the invention) has analysis evaluative printed circuit board opposed plane pair two-dimensional equivalent circuit input means for inputting information on a two-dimensional equivalent circuit of a part in which plane conductors in the form of a simulative printed circuit board for performing interference analysis evaluation are opposed to each other, a noise source, and a position serving as an observation point. It also has analysis evaluative printed circuit board adjacent interference part input means for specifying a position at which adjacent opposed plane pairs in said analysis evaluative printed circuit board equivalent circuit model induce noise interference through an adjacent interference part. It also has analysis evaluative printed circuit board adjacent interference part equivalent circuit creating means having a function of creating an equivalent circuit of the adjacent interference part at the position specified by said analysis evaluative printed circuit board adjacent interference part input means. It also has analysis evaluative whole printed circuit board equivalent circuit creating means having a function of coupling the equivalent circuit specified by said analysis evaluative printed circuit board opposed plane pair two-dimensional equivalent circuit input means with the equivalent circuit created by said analysis evaluative printed circuit board adjacent interference part equivalent circuit creating means at a position corresponding to that specified by said analysis evaluative printed circuit board adjacent interference part input means. It also has circuit solver specifying means having a function of specifying a solver for calculating an equivalent circuit. It also has suppressed-interference specifying means having a function of specifying beforehand a desired suppressed interference between a plurality of opposed plane pair equivalent circuit blocks input by said analysis evaluative printed circuit board opposed plane pair two-dimensional equivalent circuit input means. It also has interference calculating means having a function of calculating an interference by calculating an equivalent circuit created by said analysis evaluative whole printed circuit board equivalent circuit creating means using the solver specified by said circuit solver specifying means at the analysis frequency specified by said analysis evaluative printed circuit board opposed plane pair two-dimensional equivalent circuit input means, comparing the calculated interference with the suppressed interference specified by said suppressed-interference specifying means, and if the calculated interference is smaller than the suppressed interference specified by said suppressed-interference specifying means, outputting a via interval in said analysis evaluative printed circuit board adjacent interference part to an adjacent interference suppressing via positioning display section, or otherwise, prompting an analysis evaluative printed circuit board adjacent interference part via positioning specifying section to recalculation. It also has analysis evaluative printed circuit board adjacent interference part via positioning specifying means having a function of, if the interference calculated by said interference calculating means is greater than the interference specified by said suppressed-interference setting means, calculating an interval for positioning vias along the analysis evaluative printed circuit board adjacent interference part according to a certain rule, and supplying the information as an input to the analysis evaluative whole printed circuit board equivalent circuit creating section. It also has design-supporting printed circuit board structure information input means having a function of inputting information about positional information for a power supply plane and a ground plane in a design-support-target printed circuit board. It also has mesh defining means having a function of inputting a mesh interval for lattice-point generation required by a power-supply-plane/ground-plane extracting section for the design-support-target printed circuit board. It also has design-supporting printed circuit board power-supply-plane/ground-plane extracting means having a function of storing a position at which the power supply plane lies and a position at which the ground plane lies in the design-support-target printed circuit board based on the information input by said mesh defining means. It also has design-supporting printed circuit board adjacent interference part extracting means having a function of extracting, for the design-support-target printed circuit board, a region acting as an adjacent interference part in the design-support-target printed circuit board based on the information stored by said power-supply-plane/ground-plane extracting means. It also has design-supporting printed circuit board adjacent interference via positioning display means having a function of displaying vias positioning along the adjacent interference part extracted by said design-supporting printed circuit board adjacent interference part extracting means according to the recommended via positioning interval output by said interference calculating section.

A twenty-first aspect of the present invention is the twentieth aspect of the invention, wherein: a model of the analysis evaluative printed circuit board adjacent interference part equivalent circuit is constructed by using a three-port model serving as a joint equivalent circuit model between equivalent circuit models of two stacked plane pairs and an equivalent circuit model of a plane pair separate from said two pairs.

A twenty-second aspect of the present invention is the twentieth and twenty-first aspects of the invention, wherein: a model of the analysis evaluative printed circuit board adjacent interference part equivalent circuit is constructed by using an ideal transformer setting a condition that a sum of voltages in the adjacent interference part of the equivalent circuits of the two stacked pairs is equal to a voltage of the equivalent circuit model of the one non-stacked pair, said ideal transformer serving as a joint equivalent circuit model between the equivalent circuit models of the two stacked plane pairs and the equivalent circuit model of a plane pair separate from said two stacked pairs.

A twenty-third aspect of the present invention is the twentieth-twenty-second aspects of the invention, wherein: a model of the analysis evaluative printed circuit board adjacent interference part equivalent circuit is constructed by using an (N+1)-port model serving as a joint equivalent circuit model between equivalent circuit models of N (N: a natural number) stacked plain pairs and an equivalent circuit model of a plane pair separate from said N stacked pairs.

A twenty-fourth aspect of the present invention is the twentieth-twenty-third aspects of the invention, wherein: a model of the analysis evaluative printed circuit board adjacent interference part equivalent circuit is constructed by using (N−1) ideal transformers setting a condition that a sum of voltages in the adjacent interference part of the equivalent circuits of the N stacked pairs is equal to a voltage of the equivalent circuit model of the one non-stacked pair, said ideal transformers serving as a joint equivalent circuit model between the equivalent circuit models of the N (N: a natural number) stacked plain pairs and the equivalent circuit model of a plane pair separate from said N stacked pairs.

A printed circuit board design supporting method in accordance with the present invention (a twenty-fifth aspect of the invention) has an analysis evaluative printed circuit board information input step for inputting information about analysis evaluative printed circuit board opposed plane pair equivalent circuit information, an analysis evaluative printed circuit board adjacent interference part position, an analysis frequency, a suppressed interference, a circuit solver, a structure of a design-support-target printed circuit board, and a mesh definition. It also has an adjacent interference part equivalent circuit creating step for creating an equivalent circuit of the analysis evaluative printed circuit board adjacent interference part specified at said analysis evaluative printed circuit board information input step. It also has a whole printed circuit board equivalent circuit creating step for creating an equivalent circuit of the whole analysis evaluative plane circuit board by coupling the analysis evaluative printed circuit board opposed plane pair equivalent circuit input at said analysis evaluative printed circuit board information input step with the analysis evaluative adjacent interference part equivalent circuit created at said adjacent interference part equivalent circuit creating step in the analysis evaluative printed circuit board adjacent interference part specified at said analysis evaluative printed circuit board information input step, and if there exists via positioning specified by an analysis evaluative printed circuit board adjacent interference part via positioning specifying section, creating an equivalent circuit model of the vias at the corresponding positions. It also has an interference calculating step for calculating an interference by calculating a voltage value in the equivalent circuit of the whole analysis evaluative printed circuit board created at said whole printed circuit board equivalent circuit creating step using the circuit solver specified at said analysis evaluative printed circuit board information input step. It also has an interference comparing step for comparing the interference calculated at said interference calculating step with the suppressed interference specified at said analysis evaluative printed circuit board information input step, and if a case in which the interference calculated at the analysis frequency is greater than the suppressed interference is encountered, going to an adjacent interference part via positioning interval specifying step, or otherwise, going to a design-supporting printed circuit board power-supply-plane/ground-plane positional information extracting step. It also has an adjacent interference part via positioning interval specifying step for specifying a positioning interval for via in the adjacent interference part in the analysis evaluative printed circuit board using a formula with which the interval is decremented for each iteration, and going back to said whole printed circuit board equivalent circuit creating step. It also has a design-supporting printed circuit board power-supply-plane/ground-plane positional information extracting step for extracting positional information for a power supply plane and a ground plane in the design-supporting printed circuit board. It also has a design-support-target printed circuit board adjacent interference part extracting step for extracting an adjacent interference part in the design-support-target printed circuit board. It also has a design-support-target printed circuit board via displaying step for displaying vias along the adjacent interference part in the design-support-target printed circuit board at via positioning intervals specified at said adjacent interference part via positioning interval specifying step.

A twenty-sixth aspect of the present invention is the twenty-fifth aspect of the invention, wherein: a model of the analysis evaluative printed circuit board adjacent interference part equivalent circuit is constructed by using a three-port model serving as a joint equivalent circuit model between equivalent circuit models of two stacked plane pairs and an equivalent circuit model of a plane pair separate from said two pairs.

A twenty-seventh aspect of the present invention is the twenty-fifth and twenty-sixth aspects of the invention, wherein: a model of the analysis evaluative printed circuit board adjacent interference part equivalent circuit is constructed by using an ideal transformer setting a condition that a sum of voltages in the adjacent interference part of the equivalent circuits of the two stacked pairs is equal to a voltage of the equivalent circuit model of the one non-stacked pair, said ideal transformer serving as a joint equivalent circuit model between the equivalent circuit models of the two stacked plane pairs and the equivalent circuit model of a plane pair separate from said two stacked pairs.

A twenty-eighth aspect of the present invention is the twenty-fifth-twenty-seventh aspects of the invention, wherein: a model of the analysis evaluative printed circuit board adjacent interference part equivalent circuit is constructed by using an (N+1)-port model serving as a joint equivalent circuit model between equivalent circuit models of N (N: a natural number) stacked plain pairs and an equivalent circuit model of a plane pair separate from said N stacked pairs.

A twenty-ninth aspect of the present invention is the twenty-fifth-twenty-eighth aspects of the invention, wherein: a model of the analysis evaluative printed circuit board adjacent interference part equivalent circuit is constructed by using (N−1) ideal transformers setting a condition that a sum of voltages in the adjacent interference part of the equivalent circuits of the N stacked pairs is equal to a voltage of the equivalent circuit model of the one non-stacked pair, said ideal transformers serving as a joint equivalent circuit model between the equivalent circuit models of the N (N: a natural number) stacked plain pairs and the equivalent circuit model of a plane pair separate from said N stacked pairs.

A printed circuit board design supporting program in accordance with the present invention (a thirtieth aspect of the invention) is a program causing an information processing apparatus to execute: analysis evaluative printed circuit board information input processing for inputting information about analysis evaluative printed circuit board opposed plane pair equivalent circuit information, an analysis evaluative printed circuit board adjacent interference part position, an analysis frequency, a suppressed interference, a circuit solver, a structure of a design-support-target printed circuit board, and a mesh definition; adjacent interference part equivalent circuit creating processing for creating an equivalent circuit of the analysis evaluative printed circuit board adjacent interference part specified by said analysis evaluative printed circuit board information input processing; whole printed circuit board equivalent circuit creating processing for creating an equivalent circuit of the whole analysis evaluative plane circuit board by coupling the analysis evaluative printed circuit board opposed plane pair equivalent circuit input by said analysis evaluative printed circuit board information input processing with the analysis evaluative adjacent interference part equivalent circuit created by said adjacent interference part equivalent circuit creating processing in the analysis evaluative printed circuit board adjacent interference part specified by said analysis evaluative printed circuit board information input processing, and if there exists via positioning specified by an analysis evaluative printed circuit board adjacent interference part via positioning specifying section, creating an equivalent circuit model of the via at the corresponding positions; interference calculating processing for calculating an interference by calculating a voltage value in the equivalent circuit of the whole analysis evaluative printed circuit board created by said whole printed circuit board equivalent circuit creating processing using the circuit solver specified by said analysis evaluative printed circuit board information input processing; interference comparing processing for comparing the interference calculated by said interference calculating processing with the suppressed interference specified by said analysis evaluative printed circuit board information processing, and if a case in which the interference calculated at the analysis frequency is greater than the suppressed interference is encountered, going to adjacent interference part via positioning interval specifying processing, or otherwise, going to design-supporting printed circuit board power-supply-plane/ground-plane positional information extracting processing; adjacent interference part via positioning interval specifying processing for specifying a positioning interval for via in the adjacent interference part in said analysis evaluative printed circuit board using a formula with which the interval is decremented for each iteration, and going back to said whole printed circuit board equivalent circuit creating processing; design-supporting printed circuit board power-supply-plane/ground-plane positional information extracting processing for extracting positional information for a power supply plane and a ground plane in said design-supporting printed circuit board; design-support-target printed circuit board adjacent interference part extracting processing for extracting an adjacent interference part in the design-support-target printed circuit board; and design-support-target printed circuit board via displaying processing for displaying vias along the adjacent interference part in the design-support-target printed circuit board at via positioning intervals specified by said adjacent interference part via positioning interval specifying processing.

A thirty-first aspect of the present invention is the thirtieth aspect of the invention, wherein: a model of the analysis evaluative printed circuit board adjacent interference part equivalent circuit is constructed by using a three-port model serving as a joint equivalent circuit model between equivalent circuit models of two stacked plane pairs and an equivalent circuit model of a plane pair separate from said two pairs.

A thirty-second aspect of the present invention is the thirtieth and thirty-first aspects of the invention, wherein: a model of the analysis evaluative printed circuit board adjacent interference part equivalent circuit is constructed by using an ideal transformer setting a condition that a sum of voltages in the adjacent interference part of the equivalent circuits of the two stacked pairs is equal to a voltage of the equivalent circuit model of the one non-stacked pair, said ideal transformer serving as a joint equivalent circuit model between the equivalent circuit models of the two stacked plane pairs and the equivalent circuit model of a plane pair separate from said two stacked pairs.

A thirty-third aspect of the present invention is the thirtieth-thirty-second aspects of the invention, wherein: a model of the analysis evaluative printed circuit board adjacent interference part equivalent circuit is constructed by using an (N+1)-port model serving as a joint equivalent circuit model between equivalent circuit models of N (N: a natural number) stacked plain pairs and an equivalent circuit model of a plane pair separate from said N stacked pairs.

A thirty-fourth aspect of the present invention is the thirtieth-thirty-third aspects of the invention, wherein: a model of the analysis evaluative printed circuit board adjacent interference part equivalent circuit is constructed by using (N−1) ideal transformers setting a condition that a sum of voltages in the adjacent interference part of the equivalent circuits of the N stacked pairs is equal to a voltage of the equivalent circuit model of the one non-stacked pair, said ideal transformers serving as a joint equivalent circuit model between the equivalent circuit models of the N (N: a natural number) stacked plain pairs and the equivalent circuit model of a plane pair separate from said N stacked pairs.

First, a printed circuit board analyzing system, a printed circuit board analyzing method and a printed circuit board analyzing program of a first embodiment in accordance with the present invention will be described.

FIG. 1 is a block diagram showing a functional configuration of a printed circuit board analyzing system in accordance with the first embodiment of the present invention.

The printed circuit board analyzing system in accordance with the present invention includes printed circuit board opposed plane pair two-dimensional equivalent circuit input means 601, adjacent interference part input means 602, adjacent interference part circuit-model creating means 603, whole printed circuit board equivalent circuit creating means 604, voltage distribution calculating means 605, voltage distribution display means 606, and a circuit solver 607.

The printed circuit board opposed plane pair two-dimensional equivalent circuit input means 601 is means for inputting a two-dimensional equivalent circuit of a pair of opposed planes in a printed circuit board. In particular, it has a function of inputting a two-dimensional equivalent circuit of a part in the printed circuit board in which plane conductors are opposed to each other, information on positions of a noise source and an observation point, and the like.

The adjacent interference part input means 602 has a function of specifying a position at which a plurality of printed circuit board opposed plane pairs induce noise interference through an adjacent interference part.

The adjacent interference part equivalent circuit creating means 603 has a function of creating an equivalent circuit of the adjacent interference part at the position specified by the adjacent interference part input means 602.

The whole printed circuit board equivalent circuit creating means 604 has a function of coupling the equivalent circuit specified by the printed circuit board opposed plane pair two-dimensional equivalent circuit input means 601 with the equivalent circuit created by the adjacent interference part equivalent circuit creating means 603 at a position corresponding to that specified by the adjacent interference part input means 602.

The circuit solver specifying means 607 has a function of specifying a solver for calculating an equivalent circuit.

The voltage distribution calculating means 605 has a function of calculating the equivalent circuit created by the whole printed circuit board equivalent circuit creating means 604 using the solver specified by the circuit solver specifying means 607 at the analysis frequency specified by the printed circuit board opposed plane pair equivalent circuit input means 601.

The voltage distribution display means 606 has a function of displaying a calculated voltage value at the observation point specified by the printed circuit board opposed plane pair two-dimensional equivalent circuit input means 601 from among the calculated voltage values calculated by the voltage distribution calculating means 605.

Next, a processing procedure of analysis processing in the printed circuit board analyzing system in accordance with the first embodiment of the present invention will be described.

Figure 2:
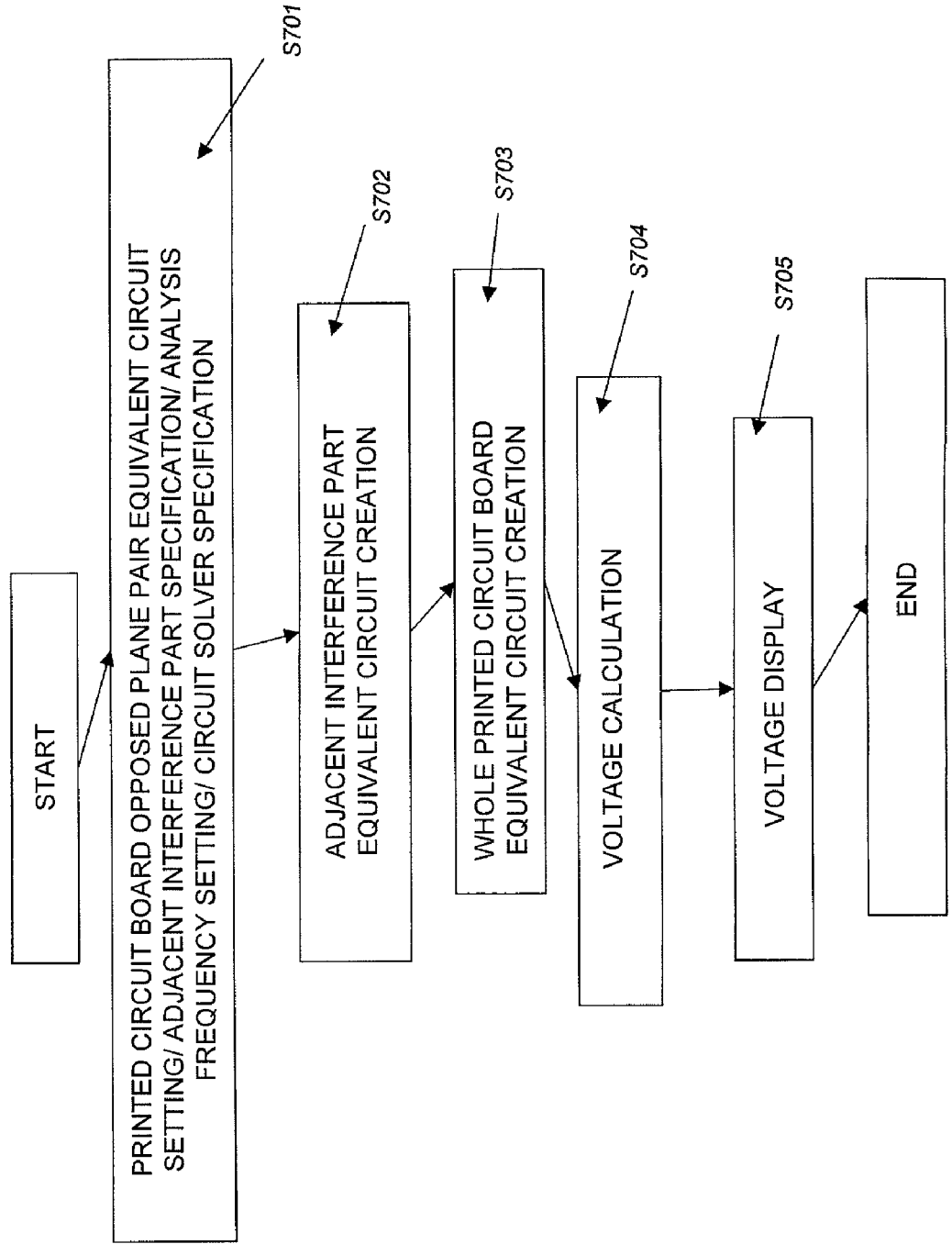
[FIG. 2] A flow chart of a printed circuit board analyzing method in the first embodiment.

FIG. 2 is a flow chart showing a procedure of analysis processing in the printed circuit board analyzing system in the embodiment of the present invention.

In the flow chart in FIG. 2, information about the printed circuit board opposed plane pair equivalent circuit, the voltage observation point, the adjacent interference part position, the analysis frequency, and the circuit solver are first input (Step 701 (S701)).

Next, an equivalent circuit of the adjacent interference part specified at S701 is created (S702). The printed circuit board opposed plane pair equivalent circuit input at S701 is then coupled with the adjacent interference part equivalent circuit created at S702 in the adjacent interference part specified at S701 to create an equivalent circuit of the whole plane circuit board (S703).

Thereafter, a voltage value of the equivalent circuit of the whole printed circuit board created at S703 is calculated using the circuit solver specified at S701 (S704). A voltage value corresponding to the voltage observation point input at S701 from among the voltage values calculated at S704 is displayed for each analysis frequency input at S701 (S705).

Next, a theory on which the printed circuit board analyzing system of the present invention is based will be described.

Figure 3:
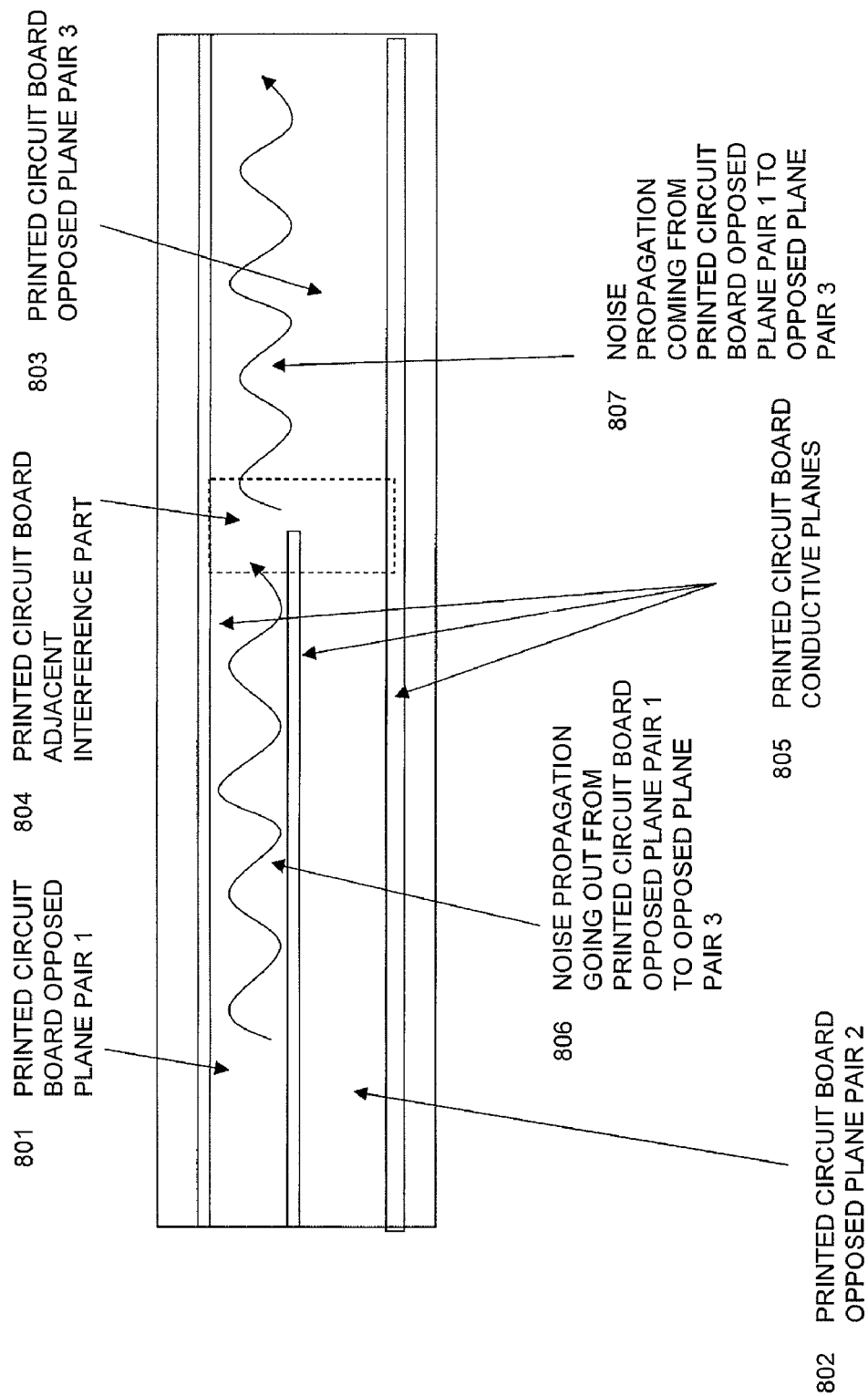
[FIG. 3] An explanatory diagram of noise causing interference in an adjacent interference part in a printed circuit board.
Figure 4:
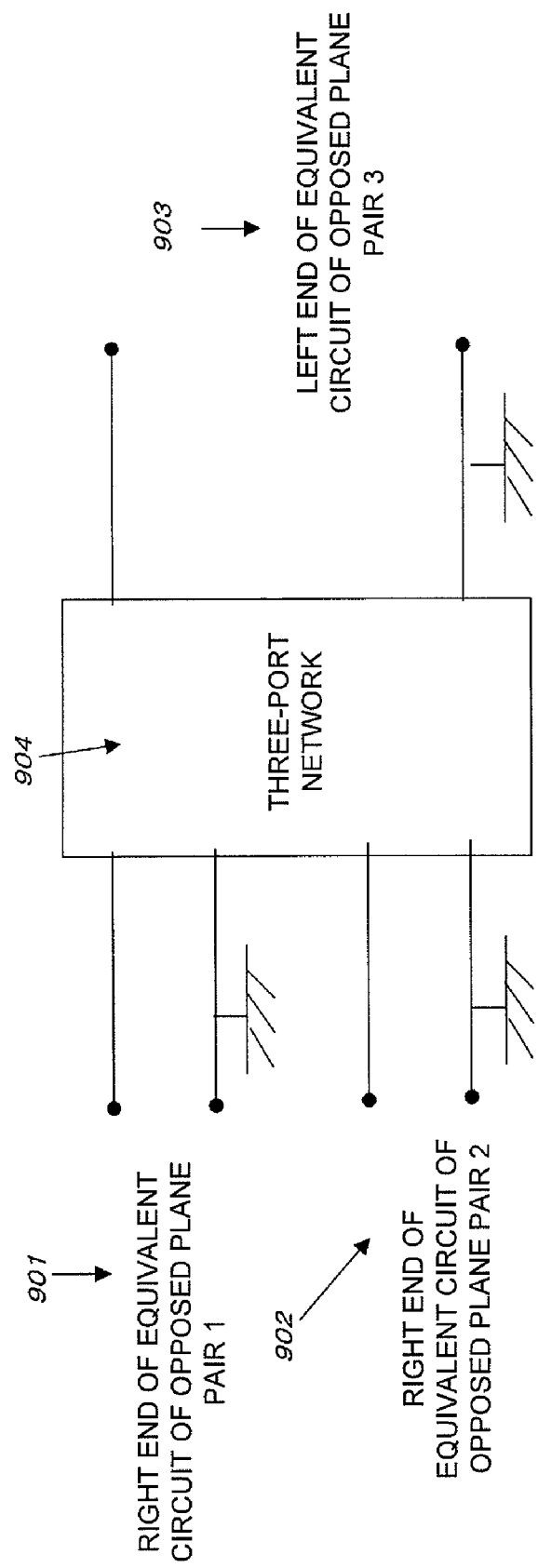
[FIG. 4] A black box diagram of an equivalent circuit of the adjacent interference part in FIG. 3.
Figure 5:
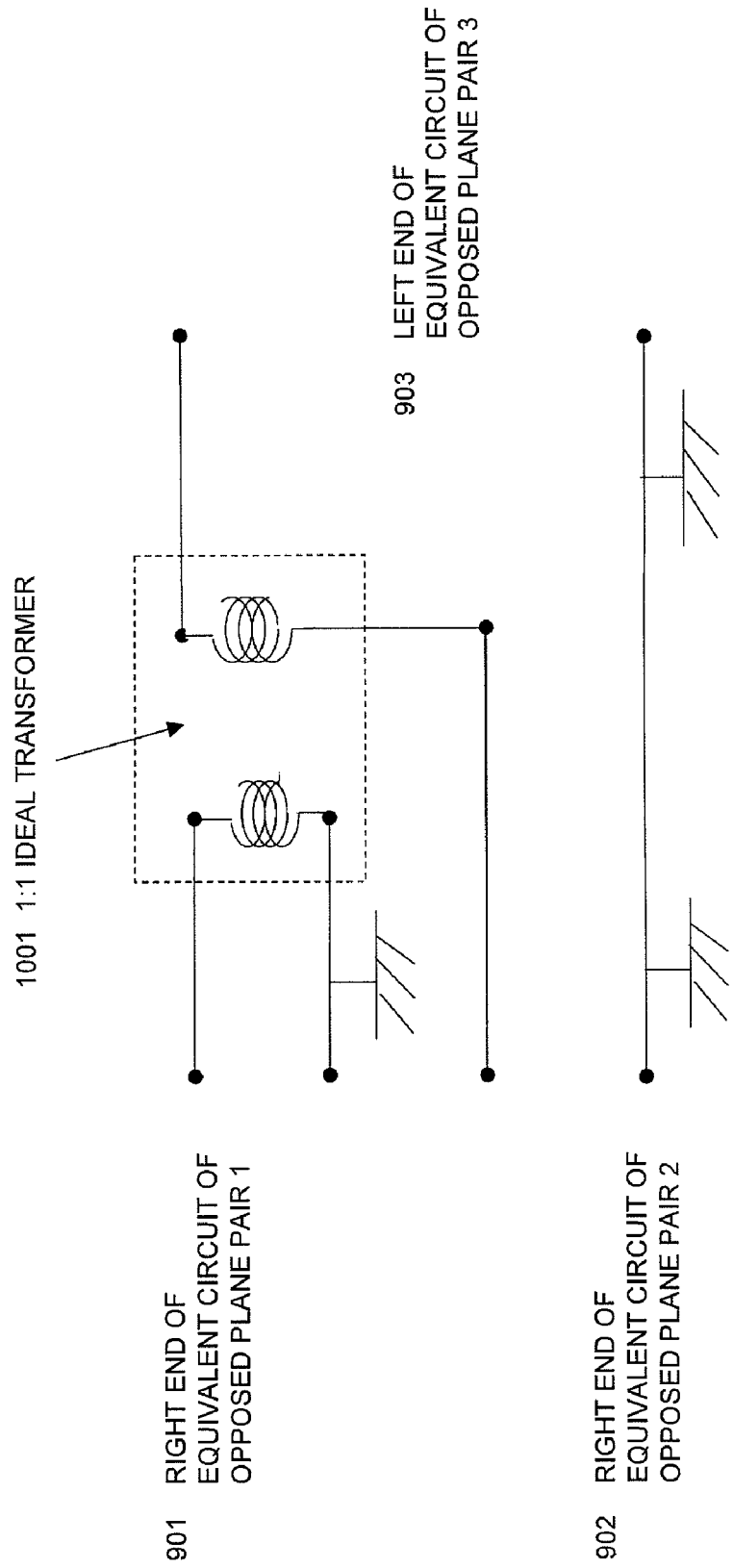
[FIG. 5] An exemplary diagram of an equivalent circuit in the black box in FIG. 4.

FIG. 3 is a side view of the vicinity of an adjacent interference part of a multi-layer printed-circuit board comprised of three conductive planes 805. An adjacent interference part 804 has on its left side a printed circuit board opposed plane pair 1 (801) and a printed circuit board opposed plane pair 2 (802) comprised of three conductive planes. The adjacent interference part 804 also has on its right side a printed circuit board opposed plane pair 3 (803) comprised of two conductive planes. For this structure, a significant part of noise (806) that has propagated through the printed circuit board opposed plane pair 1 from the left side is introduced into the printed circuit board opposed plane pair 3 on the right side. On the other hand, noise that has propagated through the printed circuit board opposed plane pair 3 (803) from the right side is introduced into the printed circuit board opposed plane pair 1 and opposed plane pair 2 through the adjacent interference part 804. Therefore, to analyze noise propagation in the printed circuit board including such a configuration, it is necessary to create a circuit model representing noise interference in the adjacent interference part in which the left opposed plane pairs 1, 2 abut on the right opposed plane pair 3, and couple the circuit models of the opposed plane pairs together. Then, as exemplarily shown in FIG. 4, it is effective to define borders of an opposed plane pair 1 equivalent circuit right end (901), an opposed plane pair 2 equivalent circuit right end (902), and an opposed plane pair 3 equivalent circuit left end (903) as input ports and represent a circuit model at the joint as a three-port input model (904). Moreover, it is also effective to assume that, in the adjacent interference part, a sum of voltage values of the two left opposed plane pairs 1, 2 is equal to a voltage value of the right opposed plane pair 3, and represent them as an equivalent circuit model using an ideal transformer (1001), as shown in FIG. 5.

Figure 6:
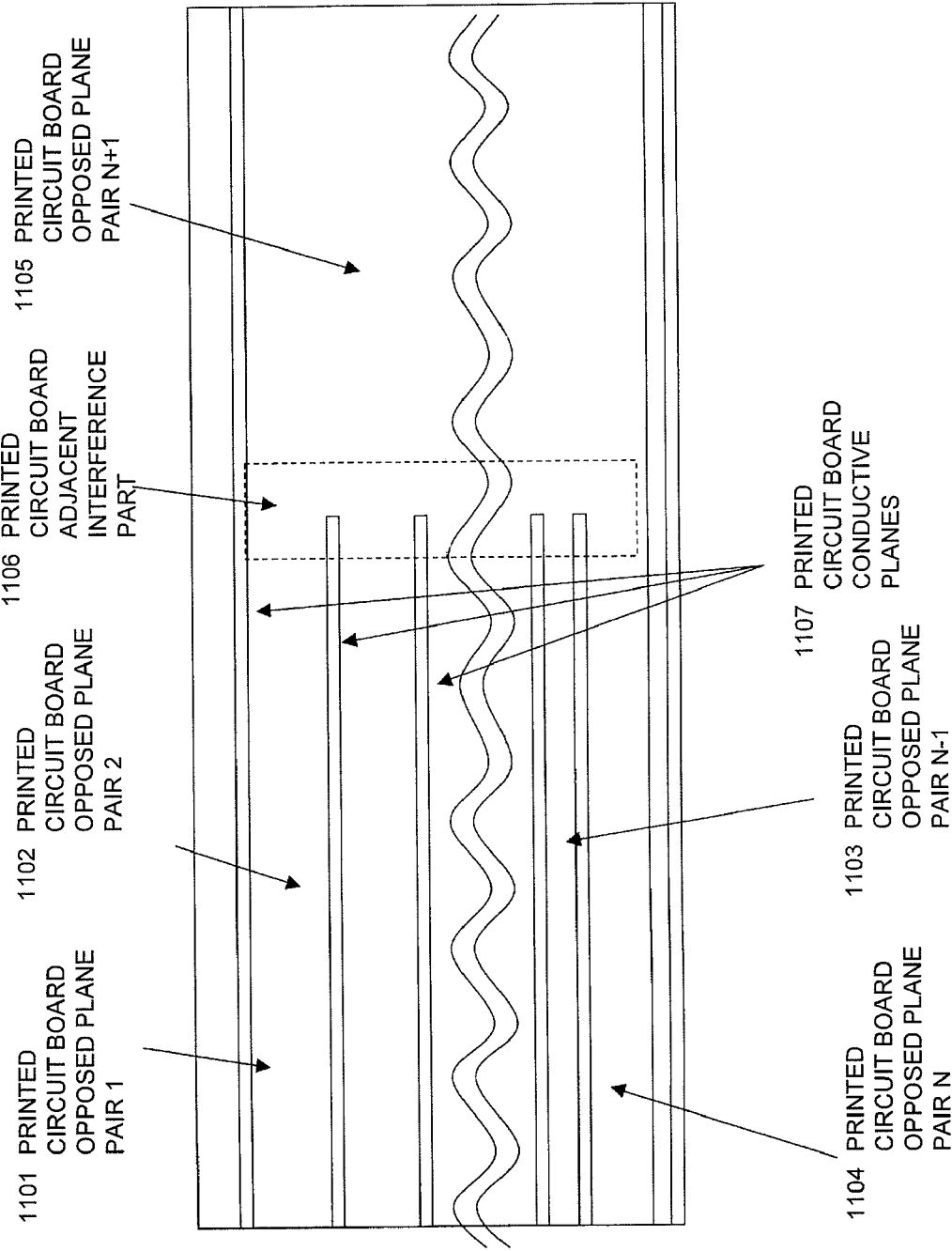
[FIG. 6] An explanatory diagram of noise causing interference in an adjacent interference part in a printed circuit board.
Figure 7:
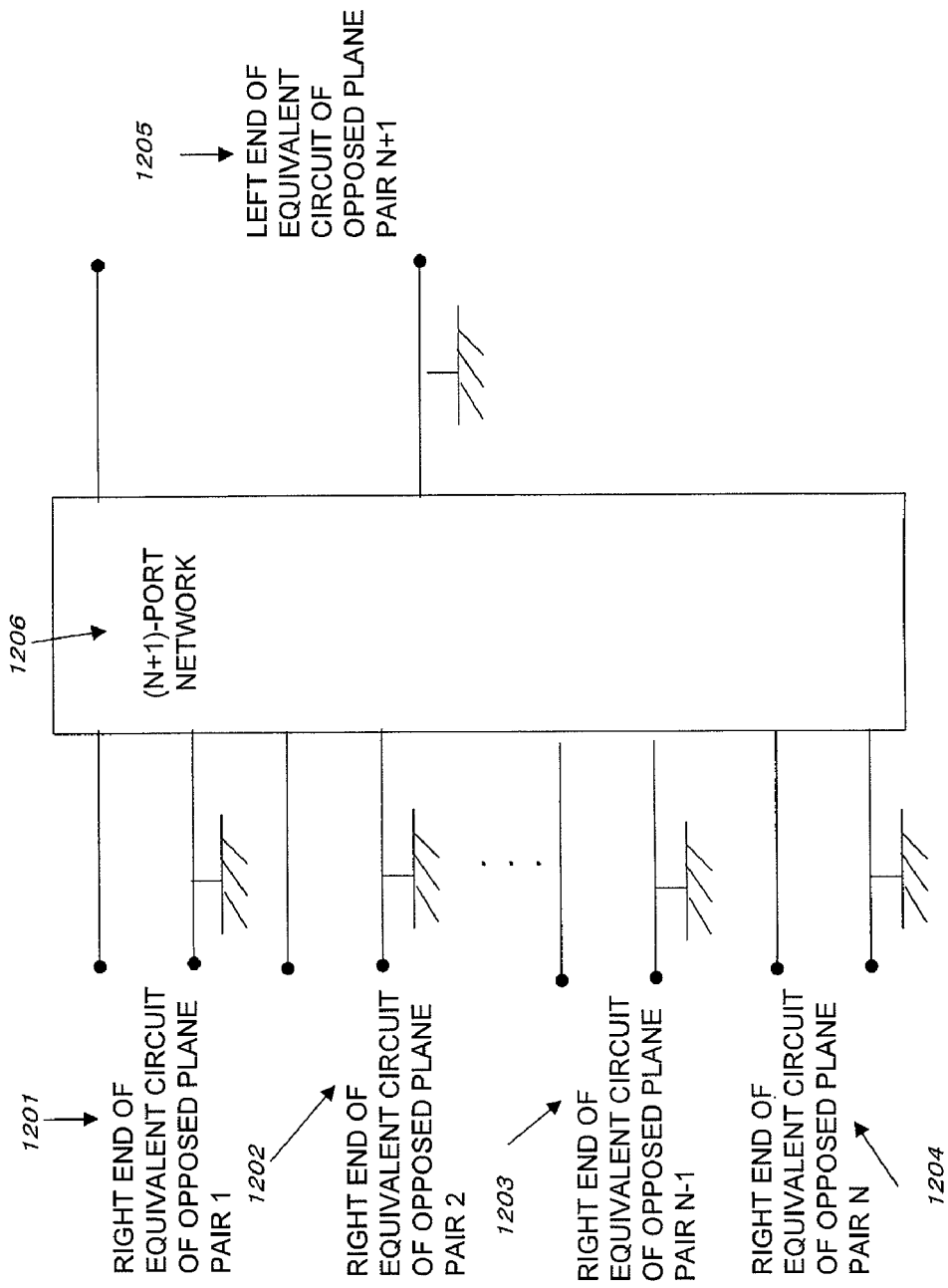
[FIG. 7] A black box diagram of an equivalent circuit of the adjacent interference part in FIG. 6.
Figure 8:
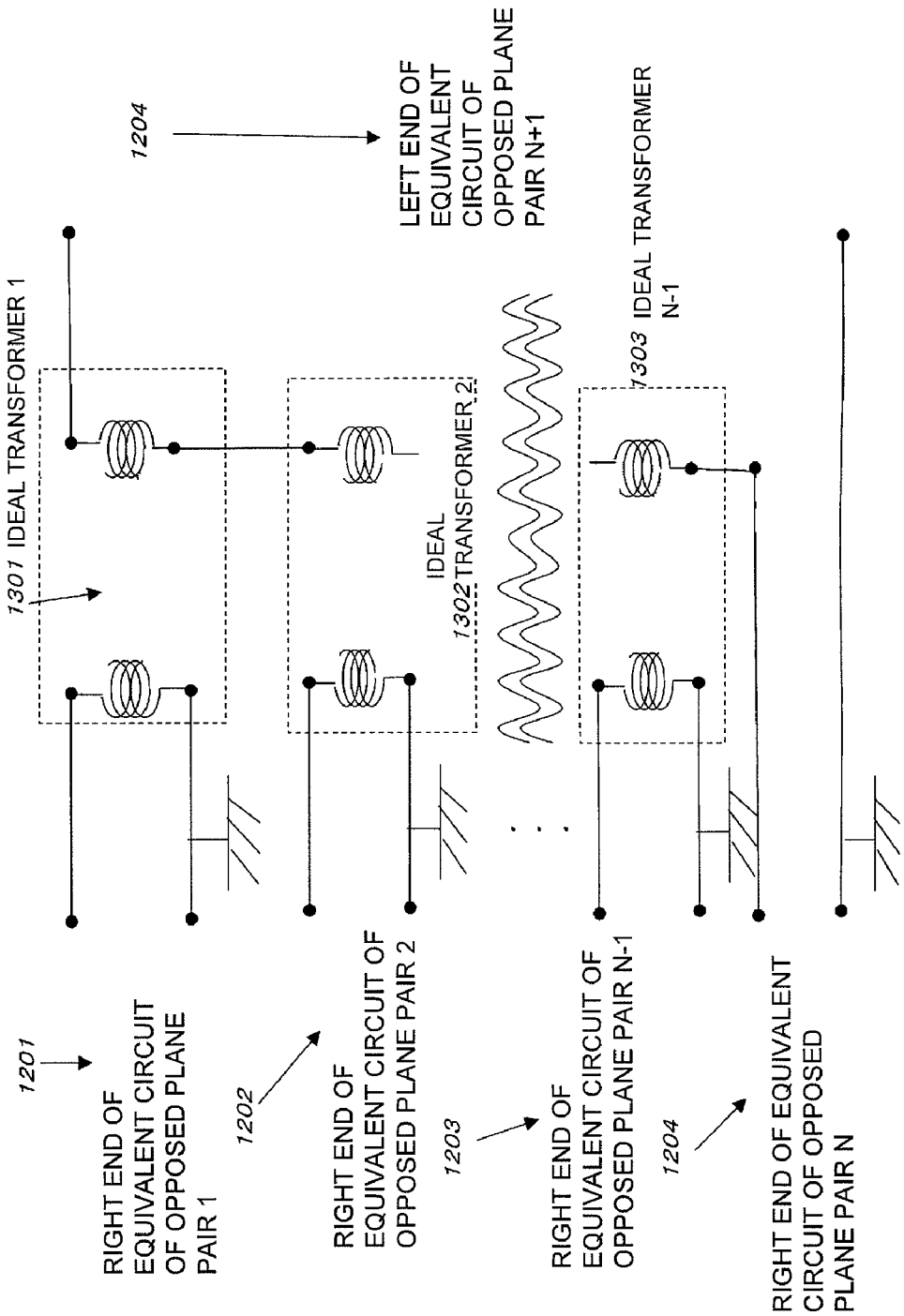
[FIG. 8] An exemplary diagram of an equivalent circuit in the black box in FIG. 7.

Furthermore, as shown in FIG. 6, an adjacent interference part having N (N is a positive natural number) plane pairs on one side and one plane pair on the other side may be represented as an (N+1)-port equivalent circuit model, as shown in FIG. 7. Alternatively, it is possible to represent it as an equivalent circuit model using (N−1) ideal transformers, as shown in FIG. 8.

Next, a printed circuit board design supporting system, a printed circuit board design supporting method and a printed circuit board design supporting program in accordance with a second embodiment of the present invention will be described.

Figure 9:
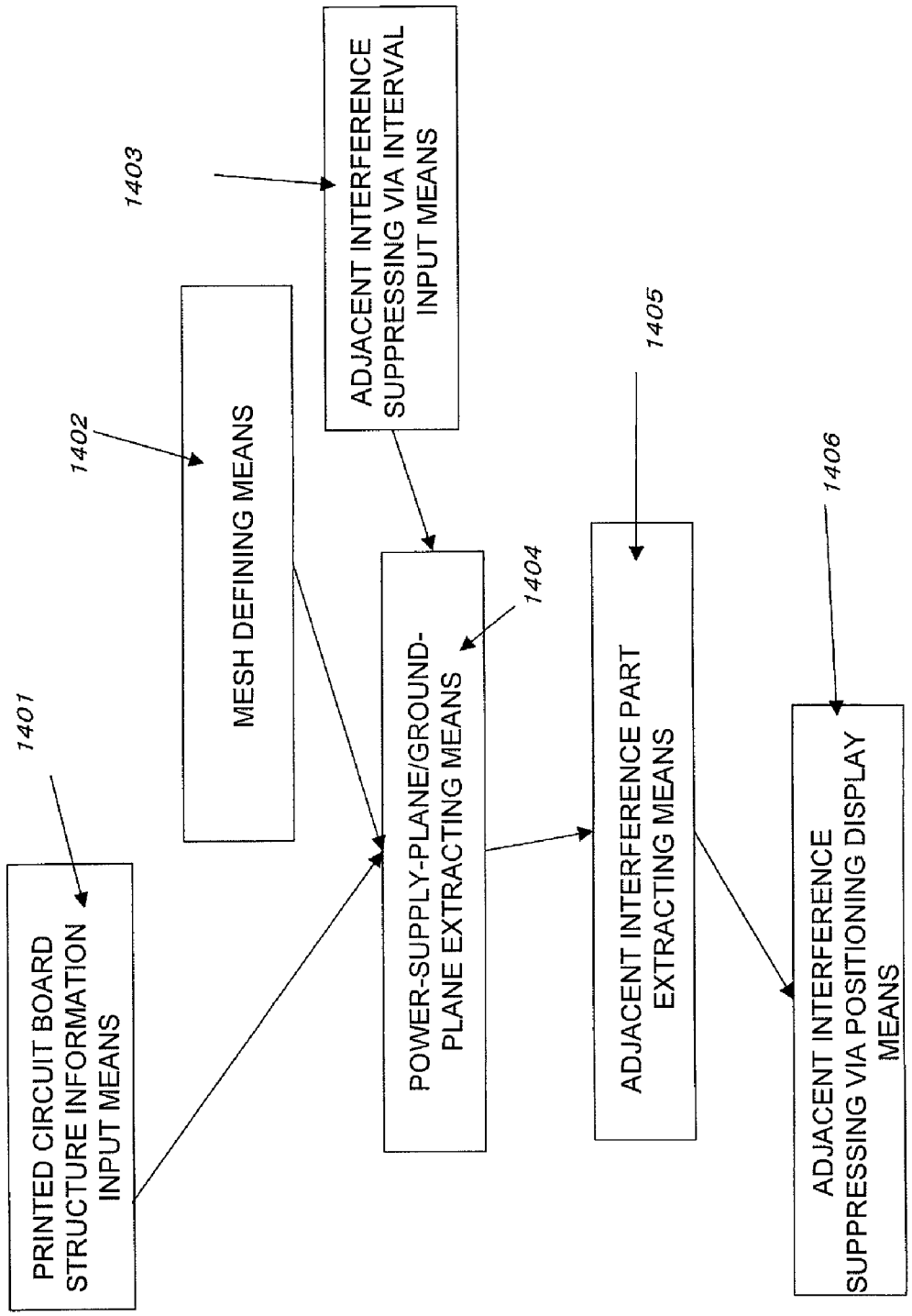
[FIG. 9] A block diagram of a printed circuit board design supporting system in a second embodiment.

FIG. 9 is a block diagram showing a functional configuration of a printed circuit board design supporting system in the second embodiment of the present invention.

The printed circuit board design supporting system in the second embodiment of the present invention includes printed circuit board structure information input means 1401, mesh defining means 1402, adjacent interference via interval input means 1403, printed circuit board power-supply-plane/ground-plane extracting means 1404, adjacent interference part extracting means 1405, and adjacent interference suppressing via positioning display means 1406.

The printed circuit board structure information input means 1401 is means for inputting information about a structure of a printed circuit board. In particular, it has a function of inputting information about positional information for a power supply plane and a ground plane in the printed circuit board.

The mesh defining means 1402 has a function of inputting a mesh interval for lattice-point generation required by the power-supply-plane/ground-plane extracting means.

The adjacent interference suppressing via interval input means 1403 has a function of inputting a via interval for adjacent interference suppressing via positioning display.

The power-supply-plane/ground-plane extracting means 1404 has a function of storing a position at which the power supply plane lies and a position at which the ground plane lies in the printed circuit board based on the information input by the mesh defining means 1402.

The adjacent interference part extracting means 1405 has a function of extracting a region acting as an adjacent interference part based on the information stored by the power-supply-plane/ground-plane extracting means 1404.

The adjacent interference suppressing via positioning display means 1406 has a function of displaying recommended via positioning along the adjacent interference part extracted by the adjacent interference part extracting means 1405 and at the via interval specified by the mesh defining means 1402.

Next, a processing procedure of analysis processing in the printed circuit board design supporting system in the second embodiment of the present invention will be described.

Figure 10:
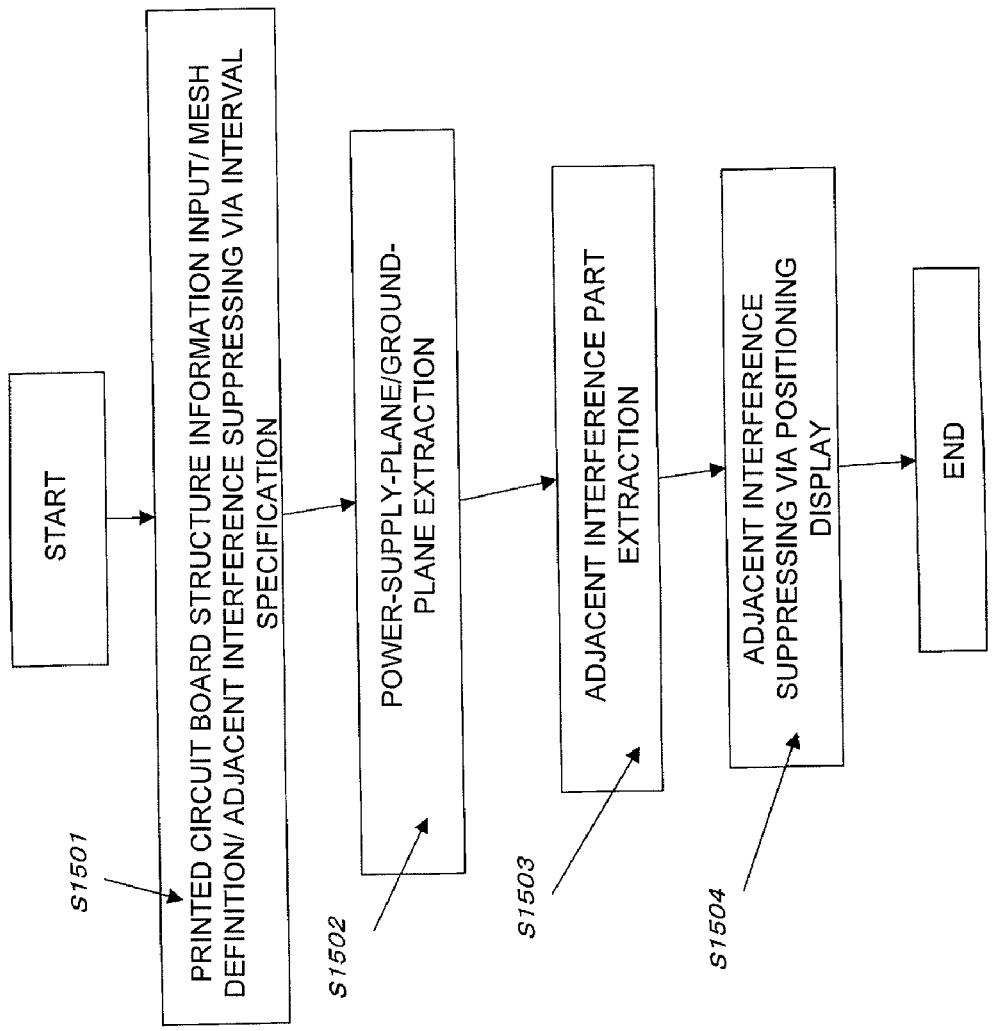
[FIG. 10] A flow chart of a printed circuit board design supporting method in the second embodiment.

FIG. 10 is a flow chart showing a procedure of analysis processing in the printed circuit board design supporting system in the embodiment of the present invention.

In the flow chart in FIG. 10, input of printed circuit board structure information, a definition of a mesh, and a specification of an adjacent interference suppressing via interval are first made (S1501).

Next, positional information for a power supply plane and a ground plane are extracted from the printed circuit board structure information specified at S1501 (S1502). Thereafter, extraction of an adjacent interference part is performed from the positional information for the power supply plane and ground plane obtained at S1502 (S1503).

Then, a mark is displayed, the mark indicating that adjacent interference suppressing ground via should be positioned along the adjacent interference part extracted at S1503 while maintaining the via interval input at S1501 (S1504).

Next, a theoretical aspect of the printed circuit board interference suppression supporting system in accordance with the second embodiment of the present invention will be described.

Figure 11:
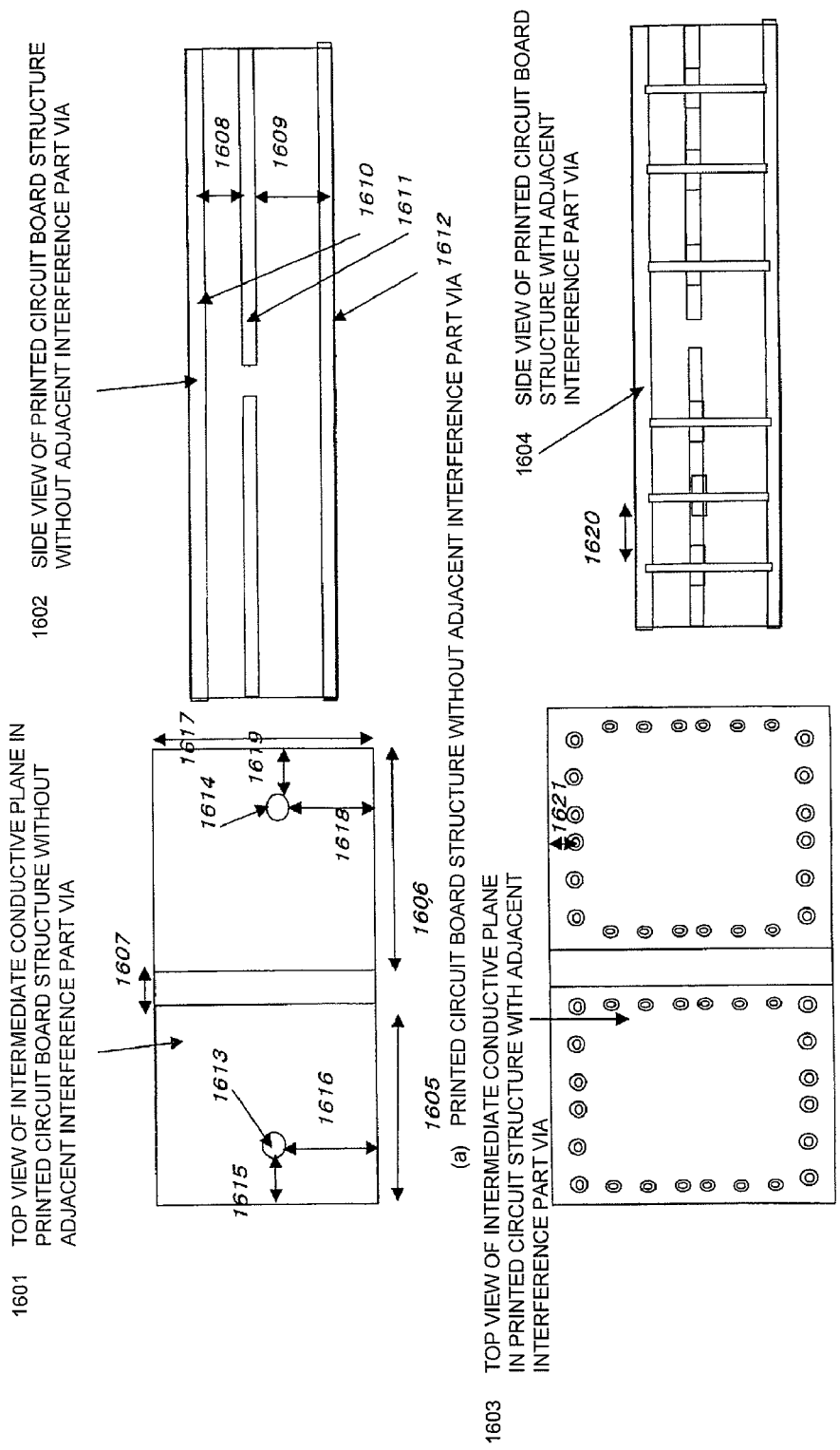
[FIG. 11] A diagram of a structure of a printed circuit board to be analyzed in the present invention.
Figure 12:
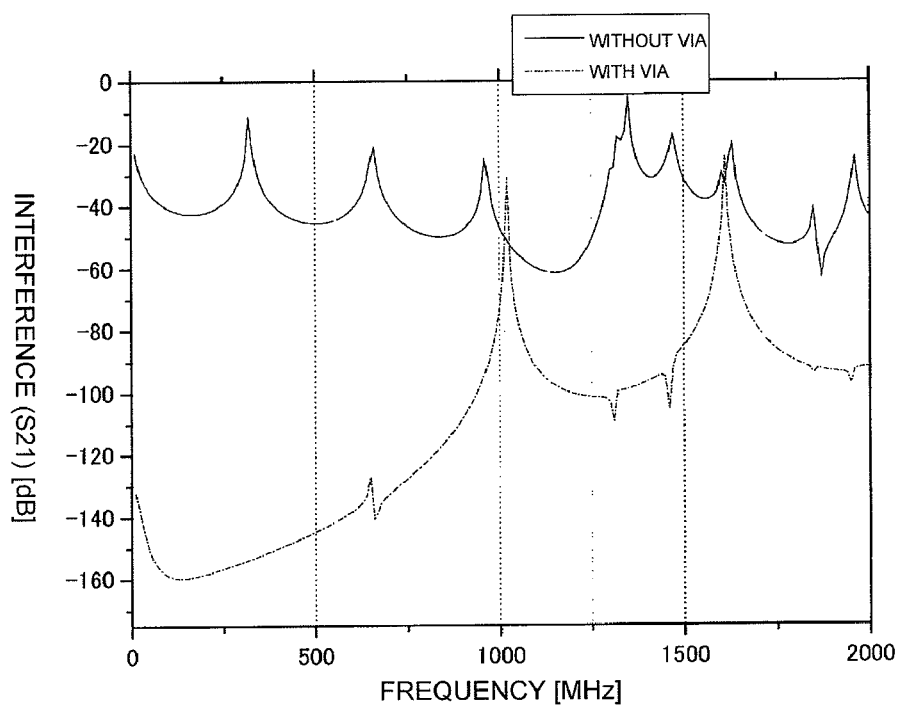
[FIG. 12] A chart showing a result of an analysis according to the printed circuit board analyzing method in the present invention applied to the printed circuit board shown in FIG. 11.

An analysis is applied to structures shown in FIG. 11(*a*), (*b*) using the printed circuit board analyzing method in the first embodiment of the present invention. By the analysis, it is possible to confirm that adjacent interference in the printed circuit board can be significantly suppressed in the printed circuit board structure with an adjacent interference part edge via shown in FIG. 11(*b*), as compared with the printed circuit board structure without an adjacent interference part edge via as in FIG. 11(*a*). For example, in the printed circuit board structure without an adjacent interference part edge via in FIG. 11(*a*), assume the following dimensions: longitudinal dimension 1617 of conductive planes: 100 mm, a transverse dimension 1605 of a left intermediate conductive plane: 100 mm, a transverse dimension 1606 of a right intermediate conductive plane: 100 mm, a distance 1607 between the right and left intermediate conductive planes: 10 mm, a thickness 1608 of a first dielectric layer: 0.4 mm, a thickness 1609 of a second dielectric layer: 1.0 mm, a distance 1615 of a noise current source 1613 lying in the first dielectric layer on the left side of the printed circuit board from a left longitudinal edge of the printed circuit board: 10 mm, a distance 1616 thereof from the transverse edge of the printed circuit board: 50 mm, a distance 1619 of an observation point position 1614 lying in the first dielectric layer on the right side of the printed circuit board from the right edge of the printed circuit board: 10 mm, and a distance 1618 thereof from the transverse edge of the printed circuit board: 50 mm. In a case of a distance 1621 from a board's edge of 5 mm and a via interval 1620 of 5 mm, a result of calculation of noise interference (S21) in the printed circuit board structure without an adjacent interference part via equivalent to that in FIG. 11(*a*) and a result of calculation of noise interference (S21) in the printed circuit board structure with adjacent interference part via equivalent to that in FIG. 11(*b*) are shown in FIG. 12. It can be seen from FIG. 12 that the structure with adjacent interference part via has a significantly smaller noise interference. Therefore, in the printed circuit board structure, it is possible to suppress suppression in the printed circuit board by positioning vias along the adjacent interference part. Hence, by providing a system for extracting the printed circuit board structure information input beforehand (in particular, for example, a part within a region of a power supply plane and ground planes in the printed board, where an area in which the ground planes are opposed to each other abuts on an area in which the power supply plane is sandwiched between a plurality of ground planes) and displaying interference-suppressing via, it is possible to support a design for suppressing interference within the printed circuit board. In addition, it is possible to provide an interference suppressing structure within a printed circuit board.

Moreover, for the structure shown in FIG. 11(*b*), since ground vias are positioned along the edge of the printed circuit board at short intervals, an effect of suppressing EMI from leaking into the outside (leaked electromagnetic wave) can be expected. It should be noted that EMI of the printed circuit board structure shown in FIG. 11(*a*), (*b*) can be calculated using the voltage value at the edge of the board. This is because an electromagnetic field emitted by a planar antenna structure can be expressed as a variation of the well-known Maxwell equation having a distribution of voltages at an edge of a planar conductor serving as an equivalent magnetic flow source (see S. Ramo, et al.: Fields and Waves in Communication Electronics, Third Edition, p. 616). In particular, a calculated voltage value at the edge of the printed circuit board structure shown in FIG. 11(*a*), (*b*) may be operated by EQ. 1 as follows:

$$E = -\frac{1}{\varepsilon}\nabla \times F \qquad [\text{EQ. 1}]$$

with $$F = \varepsilon \frac{\exp(-jkr)}{4\pi r} L$$

$$L = \int_{S_1} M_1 \exp(jkr'\cos\psi)\,dS_1 + \int_{S_2} M_2 \exp(jkr'\cos\psi)\,dS_2$$

$$M_1 = \frac{V_1}{h_1} \times n,\; M_2 = \frac{V_2}{h_2} \times n$$

where $S_1$: A border of a first dielectric layer along an edge of a printed circuit board, $S_2$: a border of a second dielectric layer along the edge of the printed circuit board, n: a unit normal vector oriented outward from the border along the board edge, $V_1$: a voltage of the first dielectric layer along an edge of a print-circuit-board power-supply/ground plane pair, $V_2$: a voltage of the second dielectric layer along the edge of the print-circuit-board power-supply/ground plane pair, $h_1$: a thickness of the first dielectric layer, $h_2$: a thickness of the second dielectric layer, ∈: a dielectric constant of a space, k: a wave number of the space, r': a distance between a coordinate origin O and a point R' at which an integral element ($dS_1$ or $dS_2$) lies, r: a distance between the coordinate origin O and an observation point R, ψ: an angle formed between line segments OR and OR', and j: a unit imaginary number.

Figure 13:
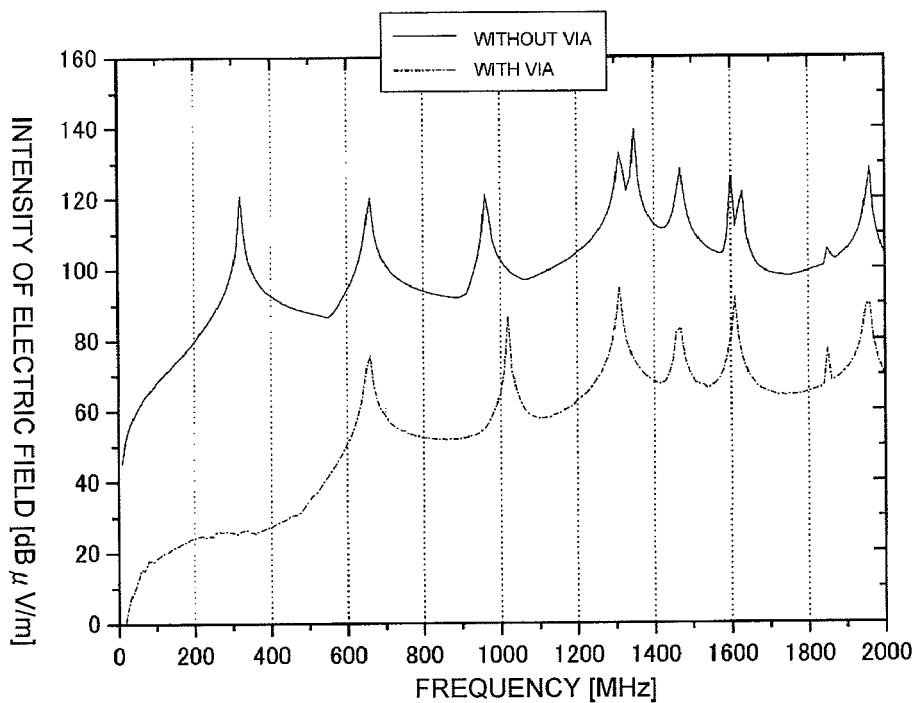
[FIG. 13] A chart showing a result of applying the printed circuit board analyzing method in the present invention to the printed circuit board shown in FIG. 11, and then calculating a far field (EMI).

A result of an EMI analysis calculated by applying [EQ. 1] to the calculated edge voltage value for a structure similar to that used in the calculation in FIG. 12 is shown in FIG. 13. It can be seen from FIG. 13 that for FIG. 11(*b*) in which the vias are positioned along an edge, EMI can be significantly suppressed as compared FIG. 11(*a*) in which no via is positioned. Therefore, by providing a system for positioning EMI-suppressing vias along a part where an area in which a power supply plane is sandwiched between a plurality of ground planes abuts on an exterior of the printed circuit board, it is possible to support a design for suppressing EMI generated from the printed circuit board. In addition, it is possible to provide an EMI suppressing structure for a printed circuit board.

Next, an operation of the power-supply-plane/ground-plane extracting section and adjacent interference part extracting section in the printed circuit board interference suppression supporting system in the second embodiment of the present invention will be described.

The power-supply-plane/ground-plane extracting section and adjacent interference part extracting section in the printed circuit board interference suppression supporting system in the second embodiment of the present invention use the information input by the printed circuit board structure information input section and that input by the mesh defining section to assign a layer index to each conductor layer in the multi-layer printed board, and moreover, divides each conductor layer into sub-regions based on the information input by the mesh defining section to assign two-dimensional coordinates and assign "1" if a sub-region falls within the power supply plane conductor or ground plane conductor, or otherwise, "0." For example, a function representing whether a coordinate point (ix, iy) of an iz-th conductor layer falls within a ground plane is defined as Grd(ix, iy, iz) and a function representing whether it falls within a power supply plane is defined as Power(ix, iy, iz) for use in decision, where iz designates a layer index of a conductor layer, and (ix, iy) is defined as a node representing two-dimensional coordinates.

Grd(ix, iy, iz)=1 (A case in which the coordinate point (ix, iy) of the iz-th conductor layer falls within the ground plane conductor);

Grd(ix, iy, iz)=0 (a case in which the coordinate point (ix, iy) of the iz-th conductor layer lies outside the ground plane conductor);

Power(ix, iy, iz)=1 (a case in which the coordinate point (ix, iy) of the iz-th conductor layer falls within the power supply plane conductor); and Power(ix, iy, iz)=0 (a case in which the coordinate point (ix, iy) of the iz-th conductor layer lies outside the power supply plane conductor).

Moreover, a function is created for extracting a region in which ground plane conductors apart from each other by two or more layers are opposed to each other, and checking a region in which a power supply plane is sandwiched therebetween. For example, a function FlagGVG(ix, iy) for two-dimensional coordinate values (ix, iy) that gives "1" if a power supply plane is sandwiched between ground planes, or otherwise, gives "0," can be created according to the following algorithm (in FORTRAN notation) with an initial condition of FlagGVG(ix, iy)=0 at all coordinate points (ix, iy):

```
do iz=1, Nz-2
   do i= iz+2, Nz
      do j= iz+3, Nz-1
         if (Grd(ix, iy, iz) = 1 .and.
             Grd(ix, iy, iz+i) = 1 .and.
             Power(ix, iy, iz+j) = 1)
            FlagGVG(ix, iy) = 1
         end if
      end do
   end do
end do
```

Moreover, for a two-dimensional coordinate point (ix, iy) that gives FlagGVG(ix, iy)=1, a point having any one of adjacent coordinate points (ix1, iy1) with FlagGVG(ix1, iy1) =0 is extracted as a collection including an adjacent interference part. Among these, if there exists any point that gives Power(ix1, iy1, iz)=0 for all iz's, the point (ix, iy) is decided to be the adjacent interference part or to abut on a printed circuit board border part whose EMI can be suppressed. Moreover, if, among the adjacent coordinate points (ix1, iy1), a point that gives Power(ix1, iy1, iz)=1 has a value of iz not sandwiched between values of iz that gives Grd(ix1, iy1, iz)=1, (ix, iy) is also decided to abut on the adjacent interference part. The thus-extracted point (ix, iy) represents where to position a ground via.

Next, a printed circuit board design supporting system, a printed circuit board design supporting method and a printed circuit board design supporting program in a third embodiment of the present invention will be described.

Figure 14:
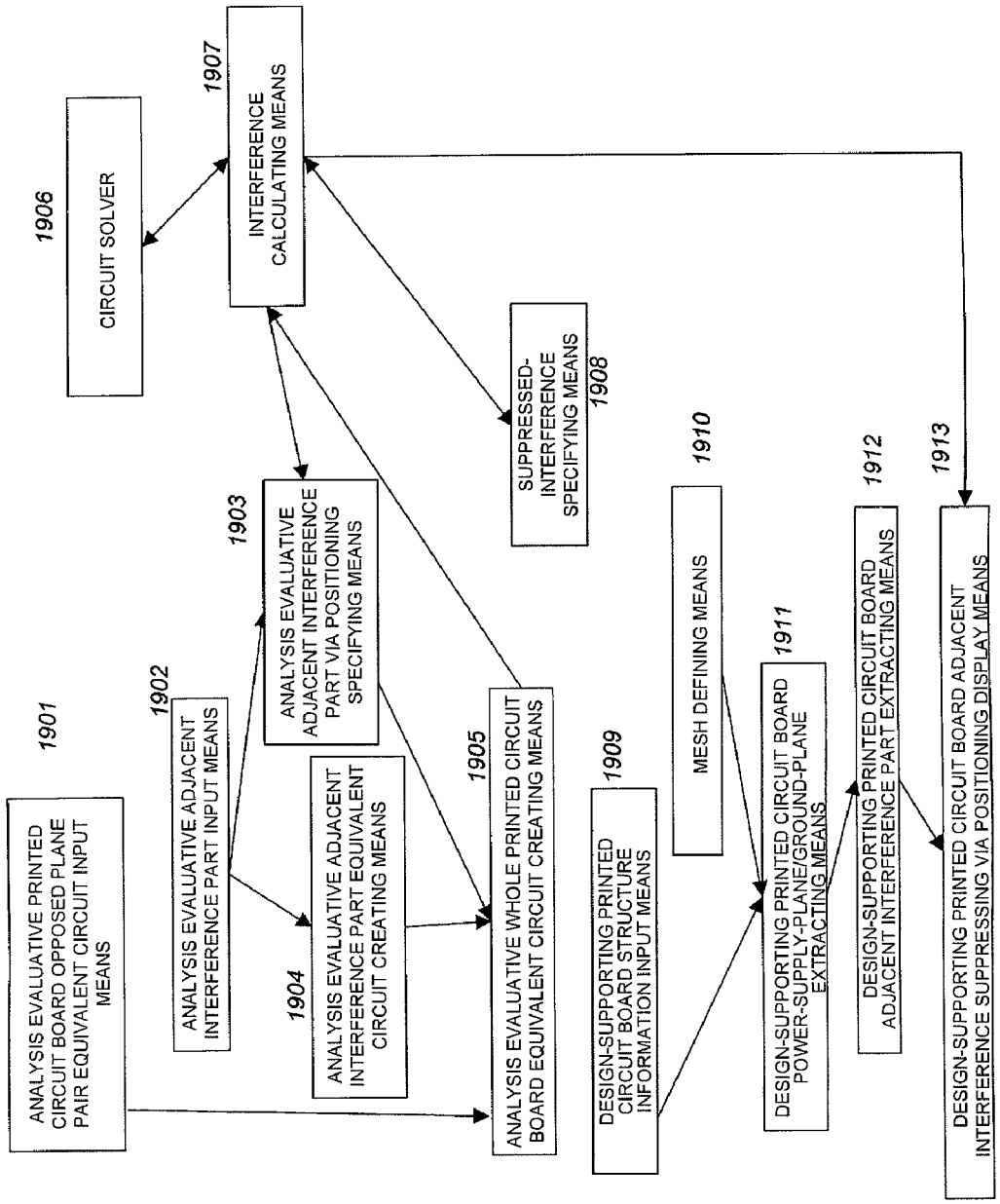
[FIG. 14] A block diagram showing a functional configuration of a printed circuit board design supporting system in a third embodiment.

FIG. 14 is a block diagram showing a functional configuration of a printed circuit board design supporting system in the third embodiment of the present invention.

The printed circuit board design supporting system in the embodiment of the present invention includes analysis evaluative printed circuit board opposed plane pair two-dimensional equivalent circuit input means 1901, analysis evaluative adjacent interference part input means 1902, analysis evaluative adjacent interference part via positioning specifying means 1903, analysis evaluative printed circuit board adjacent interference part circuit-model creating means 1904, analysis evaluative whole printed circuit board equivalent circuit creating means 1905, interference calculating means 1907, a circuit solver 1906, suppressed-interference specifying means 1908, design-supporting printed circuit board structure information input means 1909, mesh defining means 1910, design-supporting printed circuit board power-supply-plane/ground-plane extracting means 1911, design-supporting printed circuit board adjacent interference part extracting means 1912, and design-supporting printed circuit board adjacent interference suppressing via positioning display means 1913.

The analysis evaluative printed circuit board opposed plane pair two-dimensional equivalent circuit input means 1901 is means for inputting a two-dimensional equivalent circuit of a pair of opposed planes in a printed circuit board. In particular, it has a function of inputting information about a two-dimensional equivalent circuit of a part in which plane conductors in the form of a simulative printed circuit board for interference analysis evaluation are opposed to each other, and positions of a noise source and an observation point.

The analysis evaluative adjacent interference part input means 1902 has a function of specifying a position at which adjacent opposed plane pairs in the analysis evaluative printed circuit board equivalent circuit model induce noise interference through the adjacent interference part.

The analysis evaluative printed circuit board adjacent interference part equivalent circuit creating means 1904 has a function of creating an equivalent circuit of the adjacent interference part at the position specified by the analysis evaluative printed circuit board adjacent interference part input means 1902.

The analysis evaluative whole printed circuit board equivalent circuit creating means 1905 has a function of coupling the equivalent circuit specified by the analysis evaluative printed circuit board opposed plane pair two-dimensional equivalent circuit input means 1901 with the equivalent circuit created by the analysis evaluative printed circuit board adjacent interference part equivalent circuit creating means at a position corresponding to that specified by the analysis evaluative printed circuit board adjacent interference part input means 1902.

The circuit solver specifying means 1906 has a function of specifying a solver for calculating an equivalent circuit.

The suppressed-interference specifying means 1908 has a function of specifying beforehand a desired suppressed interference between a plurality of opposed plane pair equivalent circuit blocks input by the analysis evaluative printed circuit board opposed plane pair equivalent circuit input means 1901.

The interference calculating means 1907 has a function of calculating an interference by calculating an equivalent circuit created by the analysis evaluative whole printed circuit board equivalent circuit creating means 1905 using the solver specified by the circuit solver specifying means 1906 at the analysis frequency specified by the analysis evaluative printed circuit board opposed plane pair equivalent circuit input means, comparing the calculated interference with the suppressed interference specified by the suppressed-interference specifying means 1908, and if the calculated interference is smaller than the suppressed interference specified by the suppressed-interference specifying means 1908, outputting a via interval in the analysis evaluative printed circuit board adjacent interference part to the adjacent interference suppressing via positioning display means 1913, or otherwise, prompting the analysis evaluative printed circuit board adjacent interference part via positioning specifying means 1903 to recalculation.

The analysis evaluative printed circuit board adjacent interference part via positioning specifying means 1903 has a function of, if the interference calculated by the interference calculating means 1907 is greater than the interference specified by the suppressed-interference specifying means 1908, calculating an interval for positioning vias along the analysis evaluative printed circuit board adjacent interference part according to a certain rule, and supplying the information as an input to the analysis evaluative whole printed circuit board equivalent circuit creating means 1905.

The aforementioned rule for determining a positioning interval is that, as an example, a case in which a condition is not satisfied in a first run of calculation is defined as an initial condition (n=1), and more via intervals are iteratively positioned in the adjacent interference part each time the condition is not satisfied. For example, representing a length of an edge of an adjacent interference part as L, the via interval may be determined according to the following equation:

$$\Delta L = L/n \quad [\text{EQ. 2}]$$

n: An iterated function,
where n designates a number of iterations. The denominator in EQ. 2 is not limited to n but may be any number that increases for each iteration.

The design-supporting printed circuit board structure information input means 1909 is means for inputting information about a structure of the design-support-target printed circuit board. In particular, it has a function of inputting information about positional information for a power supply plane and a ground plane within the design-support-target printed circuit board.

The mesh defining means 1910 has a function of inputting a mesh interval for lattice-point generation required by the power-supply-plane/ground-plane extracting means for the design-support-target printed circuit board.

The design-supporting printed circuit board power-supply-plane/ground-plane extracting means 1911 has a function of storing a position at which the power supply plane lies and a position at which the ground plane lies in the design-support-target printed circuit board based on the information input by the mesh defining means 1910.

The design-support-target printed circuit board adjacent interference part extracting means 1912 has a function of extracting, for the design-support-target printed circuit board, a region acting as an adjacent interference part in the design-support-target printed circuit board based on the information stored by the power-supply-plane/ground-plane extracting means 1911.

The design-supporting printed circuit board adjacent interference suppressing via positioning display means 1913 has a function of displaying vias positioning along the adjacent interference part extracted by the design-supporting printed circuit board adjacent interference part extracting means 1912 according to the recommended via positioning interval output by said interference calculating section.

Next, a processing procedure of analysis processing in the printed circuit board design supporting system in accordance with the third embodiment of the present invention will be described.

Figure 15:
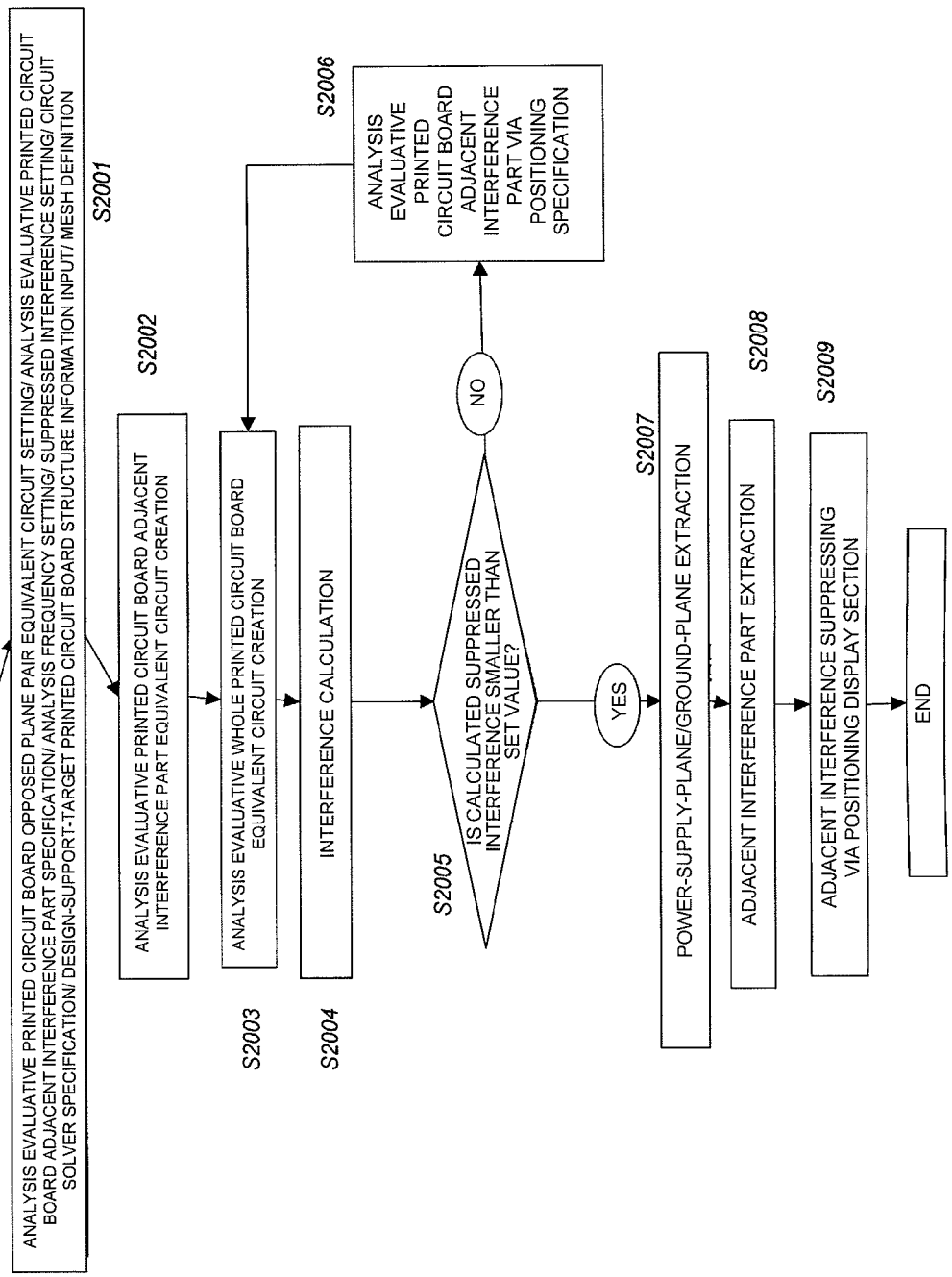
[FIG. 15] A flow chart of a printed circuit board design supporting method in the third embodiment.

FIG. 15 is a flow chart showing a procedure of analysis processing in the printed circuit board design supporting system in the embodiment of the present invention.

In the flow chart in FIG. 15, information about the analysis evaluative printed circuit board opposed plane pair equivalent circuit information, the analysis evaluative printed circuit board adjacent interference part position, the analysis frequency, the suppressed interference, the circuit solver, the design-support-target printed circuit board structure, and the mesh definition are first input (S2001).

Next, an equivalent circuit of the analysis evaluative printed circuit board adjacent interference part specified at S2001 is created (S2002).

Thereafter, the analysis evaluative printed circuit board opposed plane pair equivalent circuit input at S2001 is coupled with the analysis evaluative adjacent interference part equivalent circuit created at S2002 in the analysis evaluative printed circuit board adjacent interference part specified at S2001. In addition, if there exists any via positioning specified by the analysis evaluative printed circuit board adjacent interference part via positioning defining section, an equivalent circuit model of the via is created at the corresponding position, and an equivalent circuit of the whole analysis evaluative plane circuit board is created (S2003).

Next, a voltage value of the equivalent circuit of the whole analysis evaluative printed circuit board created at S2003 is calculated using the circuit solver specified at S2001 and an interference is calculated (S2004).

The interference calculated at S2004 is then compared with the suppressed interference specified at S2001, and if a case in which the interference calculated at the analysis frequency is greater than the suppressed interference is encountered, the process goes to S2006; otherwise, to S2007. At S2006, a positioning interval for vias is specified in the adjacent interference part in the analysis evaluative printed circuit board using an equation exemplified by [EQ. 2] with which the interval is decremented for each iteration, and then, the process goes back to S2003. At S2007, design-supporting positional information for the power supply plane/ground plane in the printed circuit board is extracted (S2007).

Next, the adjacent interference part is extracted in the design-support-target printed circuit board (S2008).

Thereafter, vias are displayed along the adjacent interference part in the design-support-target printed circuit board at analysis evaluative printed circuit board adjacent interference part via positioning intervals (S2009).

Next, a theoretical aspect of the printed circuit board interference suppression supporting system in the third embodiment of the present invention will be described.

By using the first embodiment of the present invention, it is possible to calculate an interference between adjacent plane pairs. For example, the interference may be defined as an S parameter (S21) using a voltage at a power supply point and that at an observation point with the power supply side regarded as an input port (one port) and the observation point regarded as an output port.

Then, according to the second embodiment of the present invention, it is effective to define beforehand an adjacent interference part via-positioning interval for the design-support-target printed circuit board as that satisfying the following condition [EQ. 3], which represents that the specified suppressed interference or lower is achieved at the analysis frequency using the first embodiment of the present invention.

$$S_{21}(\text{calculated value}) < S_{21}(\text{specified value}) \text{ for } \forall f \quad [\text{EQ. 3}]$$

where S21(calculated value) is a calculated interference, and S21(specified value) is a suppressed interference specified beforehand. The symbol f designates a predefined analysis frequency.

If the condition [EQ. 3] is satisfied, an optimal adjacent interference part via interval is obtained.

If the condition [EQ. 3] is not satisfied, a new adjacent interference part via interval is specified. In particular, an adjacent interference part via interval is assumed to be unspecified under an initial condition, and if the condition [EQ. 3] is not satisfied at the first step, an adjacent interference part via interval is newly set. For example, representing the length of an edge of the adjacent joint part as L, a via interval is specified such that it is decremented for each iteration, as exemplarily introduced by [EQ. 2].

The via interval is thus decremented for each step, and once the condition [EQ. 3] is satisfied, the via interval at that time may be output as an optimal adjacent interference part via interval.

Next, a hardware configuration for the printed circuit board analyzing system in the first embodiment, the printed circuit board design supporting system in the second embodiment, and the printed circuit board design supporting system in the third embodiment of the present invention will be described.

Figure 16:
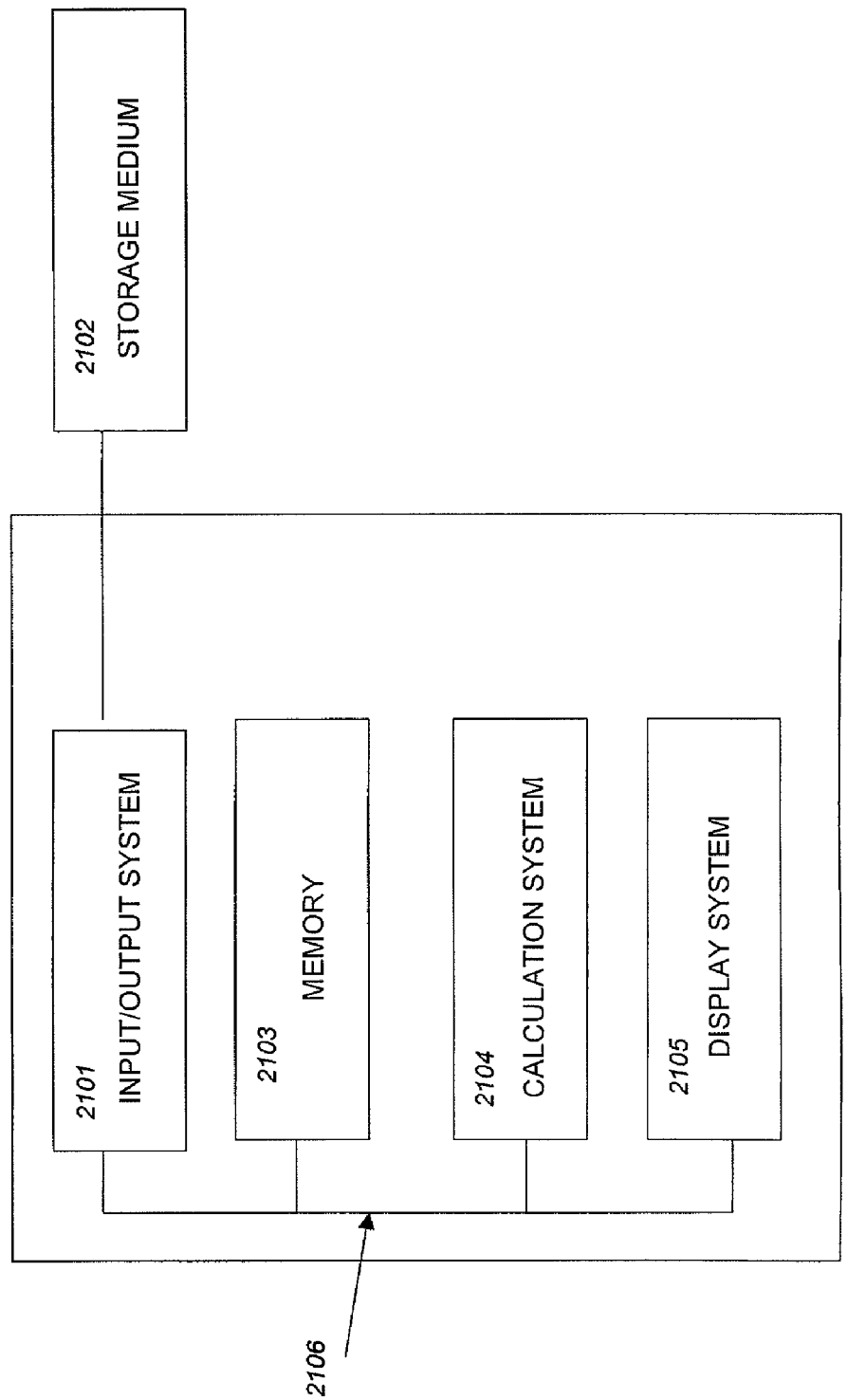
[FIG. 16] A configuration diagram of hardware of the printed circuit board analyzing system and the printed circuit board design supporting system in accordance with the present invention.
Figure 17:
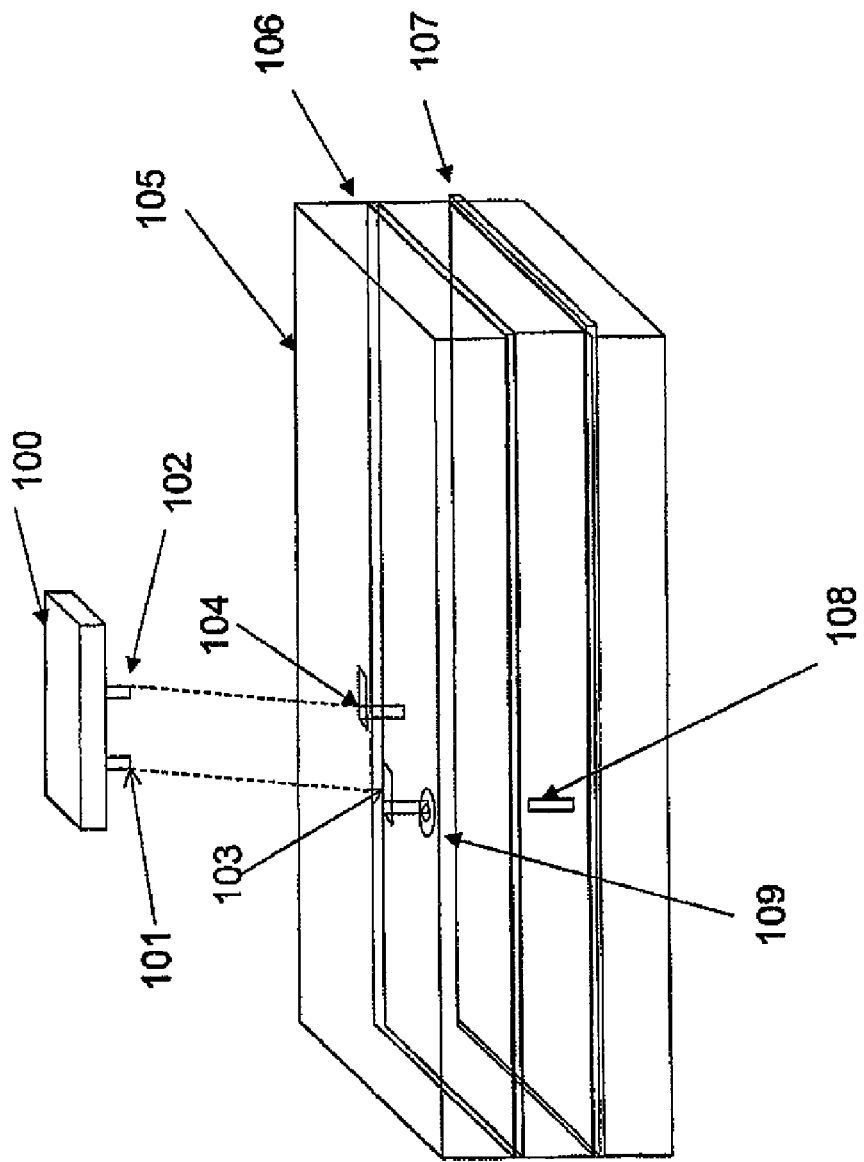
[FIG. 17] A diagram of a structure of a multi-layer printed circuit board including a pair of power-supply/ground planes, and a pair of power-supply/ground terminals for mounting on an LSI.
Figure 18:
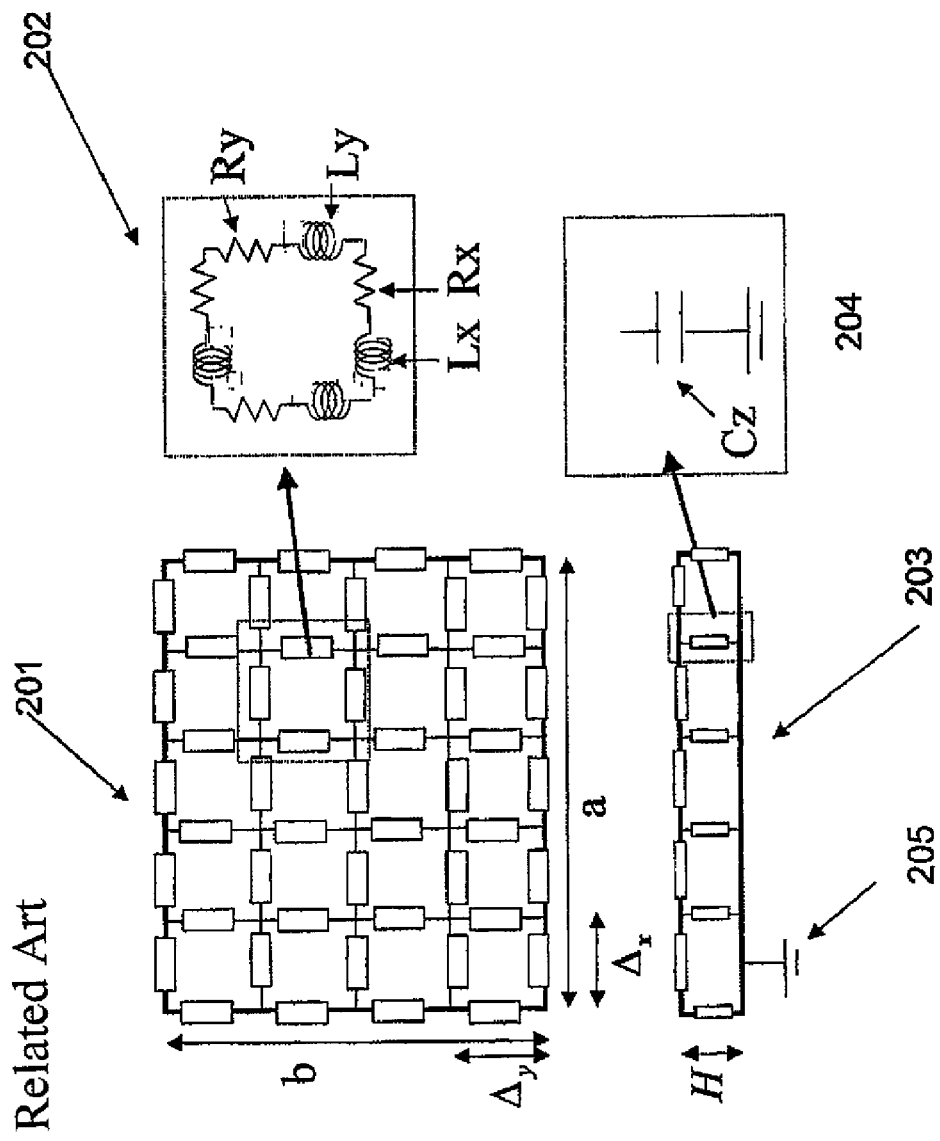
[FIG. 18] An explanatory diagram showing an equivalent circuit of a pair of power-supply/ground planes.
Figure 19:
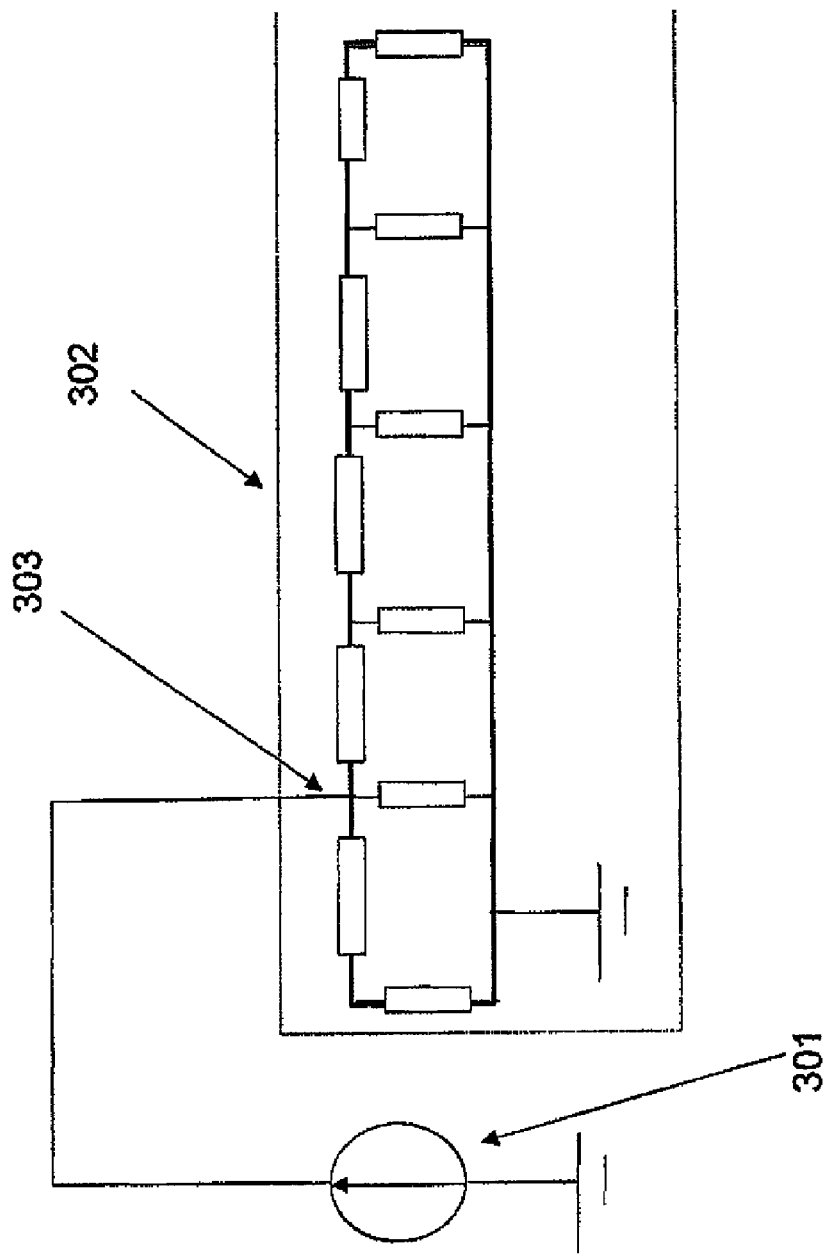
[FIG. 19] An explanatory diagram showing an equivalent circuit of a pair of power-supply/ground planes for an LSI power supply terminal regarded as a current source.
Figure 20:
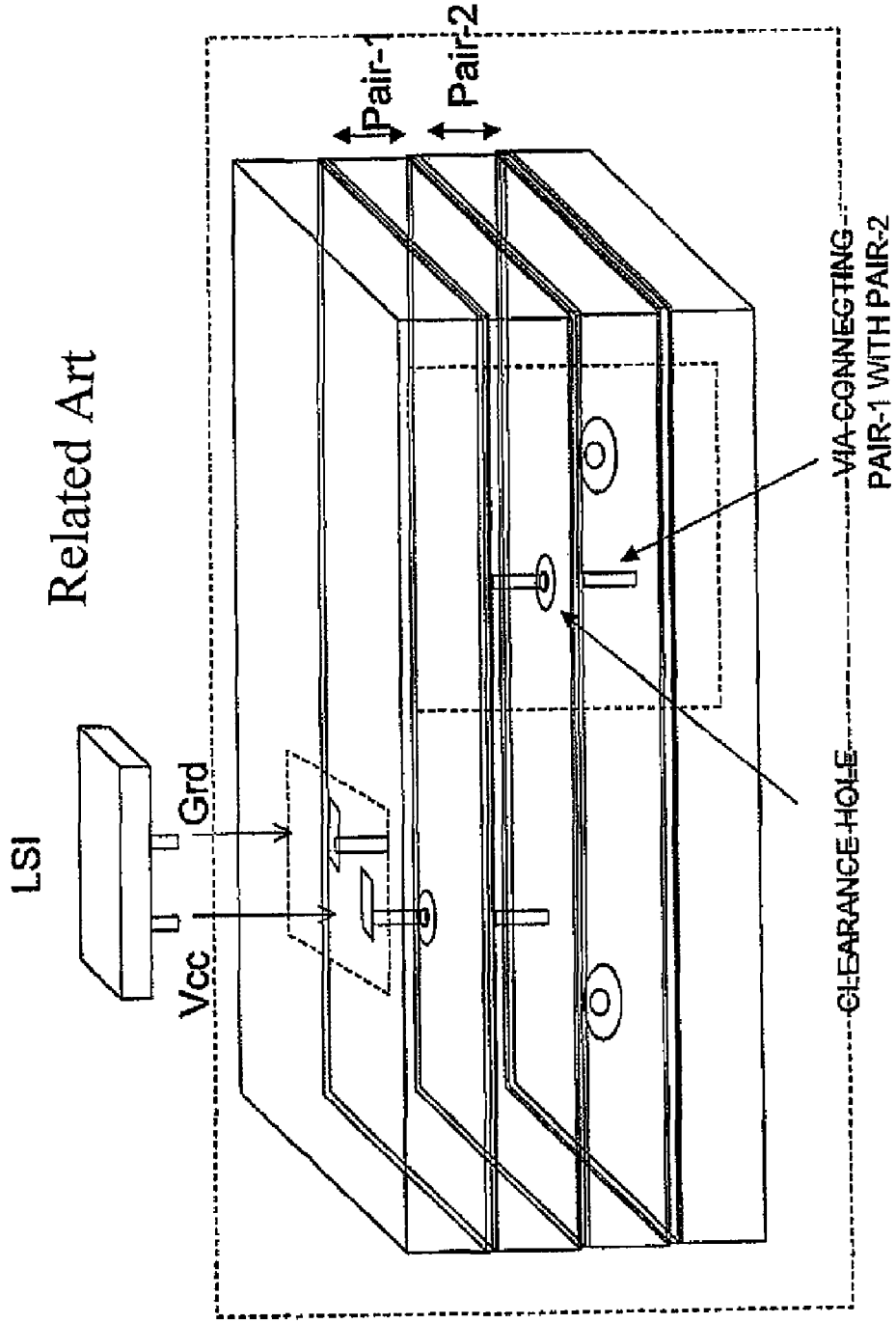
[FIG. 20] An explanatory diagram showing a structure of a multi-layer printed circuit board including two upper and lower pairs of power-supply/ground planes, a via connecting the upper and lower plane pairs, and a pair of power-supply/ground terminals for mounting on an LSI.
Figure 21:
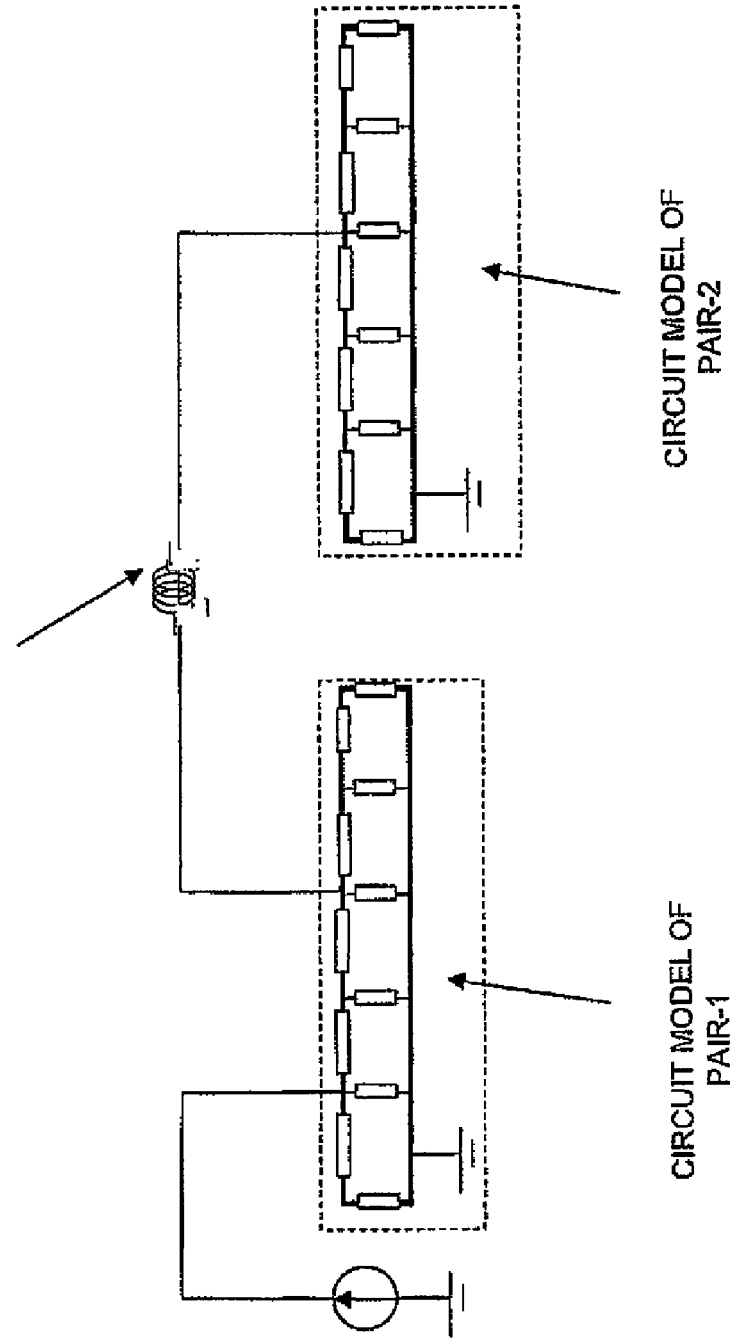
[FIG. 21] An explanatory diagram showing an equivalent circuit of the two upper and lower pairs of power-supply/ground planes and via connecting the upper and lower plane pairs.

FIG. 16 is an explanatory diagram showing a hardware configuration of the systems in the first, second and third embodiments of the present invention.

In FIG. 16, the printed circuit board analyzing system and the printed circuit board design supporting systems in the first, second and third embodiments of the present invention each comprise a recording medium 2102 storing therein a printed circuit board analyzing program, a program of SPICE, which is a circuit solver, and programs for printed circuit board power-supply/ground-plane part extraction and adjacent interference part extraction, and an analysis system. The analysis system has an input/output system 2101 for inputting/outputting of data, a memory 2103 in which the read program or data are recorded, a calculation system 2104 for performing overall control and processing such as calculation, and a display system 2105 for outputting the result of calculation. It should be noted that a path 2106 represents a path for coupling the aforementioned sections together.

A practical example of the printed circuit board analyzing system in the first embodiment of the present invention has been presented in the theoretical explanation of the first embodiment of the present invention. In particular, when the input parameters identified herein are applied to the printed circuit board having the structure shown in FIG. 11(a), a result of an analysis as shown in FIG. 12 is obtained. The same applies to a practical example of the printed circuit board design supporting system in the second embodiment of the present invention. In particular, the printed circuit board structure information is defined as in the printed circuit board structure in FIG. 11(a), and its dimensions are defined as specified hereinbefore. As a result, a structure in which vias are positioned in the adjacent interference part is displayed as in the printed circuit board structure with adjacent interference part vias as shown in FIG. 11(b). For a practical example of the printed circuit board design supporting system in the third embodiment of the present invention, the analysis evaluative printed circuit board and design-supporting printed circuit board are defined as the printed circuit board without an adjacent interference part via shown in FIG. 11(a), and the suppressed interference is defined to be −20 dB or lower for S21, whereby the condition [EQ. 3] is satisfied when the via interval is 5 mm as shown in FIG. 12, and the printed circuit board with adjacent interference part vias in FIG. 11(b) is displayed as the adjacent interference via positioning with a via interval of 5 mm.

It should be noted that the multi-layer circuit board power supply system analysis method described in the embodiments of the present invention is implemented by executing a program prepared beforehand by a computer such as a personal computer or a workstation. The program is recorded on a recording medium that is readable by the computer, such as a hard disk, CD-ROM, MO, DVD or the like, and read from the recording medium by the computer for execution. That is, a program for causing the system shown in FIG. 16 to execute the processing as described above is executed by reading it from the recording medium.

The present application claims priority based on Japanese Patent Application No. 2006-336423 filed on Dec. 13, 2006, the disclosure of which is incorporated herein in its entirety.

The invention claimed is:

1. A printed circuit board analyzing system comprising:
   printed circuit board opposed plane pair equivalent circuit input device for inputting equivalent circuits of a plurality of opposed plane pairs in a printed circuit board, a noise source, an observation point, and an analysis frequency;

adjacent interference part input device for specifying an adjacent interference part within the opposed plane pair equivalent circuits input by said printed circuit board opposed plane pair equivalent circuit input device;

adjacent interference part equivalent circuit creating device for creating an equivalent circuit of the adjacent interference part input by said adjacent interference part input device; and whole printed circuit board equivalent circuit creating device for creating a whole printed circuit board equivalent circuit by coupling the equivalent circuits input by said printed circuit board opposed plane pair equivalent circuit input device with the adjacent interference part created by said adjacent interference part equivalent circuit creating device.

2. A printed circuit board analyzing system according to claim 1, said printed circuit board analyzing system further comprising:

circuit solver specifying device for specifying a circuit solver for calculating the whole printed circuit board equivalent circuit created by said whole printed circuit board equivalent circuit creating device;

voltage calculating device for calculating the whole printed circuit board equivalent circuit created by said whole printed circuit board equivalent circuit creating device using the circuit solver specified by said circuit solver specifying device at the analysis frequency input by said printed circuit board opposed plane pair equivalent circuit input device; and voltage display device for displaying a calculated voltage value at the observation point specified by said printed circuit board opposed plane pair equivalent circuit input device from among the calculated voltage values calculated by said voltage calculating device.

3. A printed circuit board analyzing system according to claim 1, wherein a model of the adjacent interference part equivalent circuit is constructed by using a three-port model serving as a joint equivalent circuit model between equivalent circuit models of two stacked plane pairs and an equivalent circuit model of a plane pair separate from said two pairs.

4. A printed circuit board analyzing system according to claim 1, wherein a model of the adjacent interference part equivalent circuit is constructed by using an ideal transformer setting a condition that a sum of voltages in the adjacent interference part of the equivalent circuits of two stacked pairs is equal to a voltage of the equivalent circuit model of one non-stacked pair, said ideal transformer serving as a joint equivalent circuit model between the equivalent circuit models of the two stacked plane pairs and the equivalent circuit model of a plane pair separate from said two stacked pairs.

5. A printed circuit board analyzing system according to claim 1, wherein a model of the adjacent interference part equivalent circuit is constructed by using an (N+1)-port model serving as a joint equivalent circuit model between equivalent circuit models of N (N: a natural number) stacked plain pairs and an equivalent circuit model of a plane pair separate from said N stacked pairs.

6. A printed circuit board analyzing system according to claim 1, wherein a model of the adjacent interference part equivalent circuit is constructed by using (N−1) ideal transformers setting a condition that a sum of voltages in the adjacent interference part of the equivalent circuits of N stacked pairs is equal to a voltage of the equivalent circuit model of one non-stacked pair, said ideal transformers serving as a joint equivalent circuit model between the equivalent circuit models of the N (N: a natural number) stacked plain pairs and the equivalent circuit model of a plane pair separate from said N stacked pairs.

7. A printed circuit board analyzing method comprising:

a printed circuit board opposed plane pair equivalent circuit input step using a computer for inputting information about opposed plane pair equivalent circuits in a printed circuit board, a voltage observation point, an adjacent interference part position, an analysis frequency, and a circuit solver;

an adjacent interference part equivalent circuit creating step using a computer for creating an equivalent circuit of the printed circuit board adjacent interference part input at said printed circuit board opposed plane pair equivalent circuit input step;

a whole printed circuit board equivalent circuit creating step using a computer for creating an equivalent circuit of the whole printed circuit board by coupling the printed circuit board opposed plane pair equivalent circuits input at said printed circuit board opposed plane pair equivalent circuit input step with the adjacent interference part equivalent circuit created at said adjacent interference part equivalent circuit creating step in the adjacent interference part specified at said printed circuit board opposed plane pair equivalent circuit input step;

a voltage calculating step using a computer for calculating a voltage value in the equivalent circuit of the whole printed circuit board created at said whole printed circuit board equivalent circuit creating step using a circuit solver; and a calculated voltage value displaying step using a computer for displaying for each analysis frequency a voltage value corresponding to the voltage observation point input at said printed circuit board opposed plane pair equivalent circuit input step from among the voltage values calculated at said voltage calculating step.

8. A printed circuit board analyzing method according to claim 7, wherein a model of the adjacent interference part equivalent circuit is constructed by using a three-port model serving as a joint equivalent circuit model between equivalent circuit models of two stacked plane pairs and an equivalent circuit model of a plane pair separate from said two pairs.

9. A printed circuit board analyzing method according to claim 7, wherein a model of the adjacent interference part equivalent circuit is constructed by using an ideal transformer setting a condition that a sum of voltages in the adjacent interference part of the equivalent circuits of two stacked pairs is equal to a voltage of the equivalent circuit model of one non-stacked pair, said ideal transformer serving as a joint equivalent circuit model between the equivalent circuit models of the two stacked plane pairs and the equivalent circuit model of a plane pair separate from said two stacked pairs.

10. A printed circuit board analyzing method according to claim 7, wherein a model of the adjacent interference part equivalent circuit is constructed by using an (N+1)-port model serving as a joint equivalent circuit model between equivalent circuit models of N (N: a natural number) stacked plain pairs and an equivalent circuit model of a plane pair separate from said N stacked pairs.

11. A printed circuit board analyzing method according to claim 7, wherein a model of the adjacent interference part equivalent circuit is constructed by using (N−1) ideal transformers setting a condition that a sum of voltages in the adjacent interference part of the equivalent circuits of N stacked pairs is equal to a voltage of the equivalent circuit model of one non-stacked pair, said ideal transformers serving as a joint equivalent circuit model between the equivalent circuit models of the N (N: a natural number) stacked plain pairs and the equivalent circuit model of a plane pair separate from said N stacked pairs.

12. A non-transitory recording medium in which a printed circuit board analyzing program is recorded, said printed circuit board analyzing program causing an information processing apparatus to execute:
- printed circuit board opposed plane pair equivalent circuit input processing for inputting information about opposed plane pair equivalent circuits in a printed circuit board, a voltage observation point, an adjacent interference part position, an analysis frequency, and a circuit solver;
- adjacent interference part equivalent circuit creating processing for creating an equivalent circuit of the printed circuit board adjacent interference part input by said printed circuit board opposed plane pair equivalent circuit input processing;
- whole printed circuit board equivalent circuit creating processing for creating an equivalent circuit of a whole printed circuit board by coupling the printed circuit board opposed plane pair equivalent circuits input by said printed circuit board opposed plane pair equivalent circuit input processing with the adjacent interference part equivalent circuit created by said adjacent interference part equivalent circuit creating processing in the adjacent interference part specified by said printed circuit board opposed plane pair equivalent circuit input processing;
- voltage calculating processing for calculating a voltage value in the equivalent circuit of the whole printed circuit board created by said whole printed circuit board equivalent circuit creating processing using a circuit solver; and
- calculated voltage value displaying processing for displaying for each analysis frequency a voltage value corresponding to the voltage observation point input by said printed circuit board opposed plane pair equivalent circuit input processing from among the voltage values calculated by said voltage calculating processing.

13. A recording medium according to claim 12, wherein a model of the adjacent interference part equivalent circuit is constructed by using a three-port model serving as a joint equivalent circuit model between equivalent circuit models of two stacked plane pairs and an equivalent circuit model of a plane pair separate from said two pairs.

14. A recording medium according to claim 12, wherein a model of the adjacent interference part equivalent circuit is constructed by using an ideal transformer setting a condition that a sum of voltages in the adjacent interference part of the equivalent circuits of two stacked pairs is equal to a voltage of the equivalent circuit model of one non-stacked pair, said ideal transformer serving as a joint equivalent circuit model between the equivalent circuit models of the two stacked plane pairs and the equivalent circuit model of a plane pair separate from said two stacked pairs.

15. A recording medium according to claim 12, wherein a model of the adjacent interference part equivalent circuit is constructed by using an $(N+1)$-port model serving as a joint equivalent circuit model between equivalent circuit models of N (N: a natural number) stacked plain pairs and an equivalent circuit model of a plane pair separate from said N stacked pairs.

16. A recording medium according to claim 12, wherein a model of the adjacent interference part equivalent circuit is constructed by using $(N-1)$ ideal transformers setting a condition that a sum of voltages in the adjacent interference part of the equivalent circuits of N stacked pairs is equal to a voltage of the equivalent circuit model of one non-stacked pair, said ideal transformers serving as a joint equivalent circuit model between the equivalent circuit models of the N (N: a natural number) stacked plain pairs and the equivalent circuit model of a plane pair separate from said N stacked pairs.

\* \* \* \* \*